(12) United States Patent
Meyer et al.

(10) Patent No.: US 7,759,242 B2
(45) Date of Patent: Jul. 20, 2010

(54) METHOD OF FABRICATING AN INTEGRATED CIRCUIT

(75) Inventors: Steffen Meyer, Dresden (DE); Rolf Weis, Dresden (DE); Burkhard Ludwig, Munich (DE); Christoph Noelscher, Nuremberg (DE)

(73) Assignee: Qimonda AG, Munich (DE)

( * ) Notice: Subject to any disclaimer, the term of this patent is extended or adjusted under 35 U.S.C. 154(b) by 404 days.

(21) Appl. No.: 11/843,052

(22) Filed: Aug. 22, 2007

(65) Prior Publication Data

US 2009/0053892 A1 Feb. 26, 2009

(51) Int. Cl.
*H01L 21/20* (2006.01)

(52) U.S. Cl. .................. 438/618; 438/622; 438/634; 438/636; 438/694; 438/717; 257/E21.027; 257/E21.038; 257/E21.179; 257/E21.257; 257/E21.579

(58) Field of Classification Search ......... 438/597–722, 438/788; 257/179, 257, 577–591
See application file for complete search history.

(56) References Cited

U.S. PATENT DOCUMENTS

| | | | |
|---|---|---|---|
| 5,239,199 A | | 8/1993 | Chiu |
| 5,893,748 A * | | 4/1999 | Lin .............................. 438/618 |
| 5,916,821 A | | 6/1999 | Kerber |
| 6,110,837 A * | | 8/2000 | Linliu et al. ................. 438/723 |
| 6,204,187 B1 | | 3/2001 | Rupp et al. |
| 6,319,840 B1 | | 11/2001 | Costrini et al. |
| 6,440,613 B1 * | | 8/2002 | Doan ............................. 430/5 |
| 6,610,607 B1 * | | 8/2003 | Armbrust et al. ............. 438/717 |
| 6,660,546 B2 * | | 12/2003 | Ezaki ........................ 29/25.03 |
| 6,869,542 B2 * | | 3/2005 | Desphande et al. ........... 216/51 |
| 7,202,174 B1 * | | 4/2007 | Jung et al. ................... 438/694 |
| 7,265,056 B2 * | | 9/2007 | Tsai et al. .................... 438/725 |
| 7,297,983 B2 | | 11/2007 | Hecht et al. |
| 7,314,691 B2 * | | 1/2008 | Hata et al. .................... 430/14 |
| 7,384,874 B2 * | | 6/2008 | Jung ........................... 438/700 |
| 7,498,106 B2 * | | 3/2009 | Mui et al. ...................... 430/30 |

(Continued)

FOREIGN PATENT DOCUMENTS

CN 1187032 A 7/1998

(Continued)

OTHER PUBLICATIONS

Hasegawa, M., et al., "Practical Applications of IDEAL Exposure Method," 19th Annual BACUS Symposium on Photomask Technology, Proceedings of SPIE vol. 3873, Sep. 1999, pp. 66-77, Society of Photographic Instrumentation Engineers.

(Continued)

*Primary Examiner*—Michael S Lebentritt
(74) *Attorney, Agent, or Firm*—Slater & Matsil, L.L.P.

(57) ABSTRACT

A method of fabricating an integrated circuit, including the steps of forming a first mask layer in the form of a hard mask layer including a plurality of first openings and a second mask layer with at least one second opening which at least partially overlaps with one of the first openings, wherein the at least one second opening is generated lithographically; and at least two neighboring first openings are distanced from each other with a center to center pitch smaller than the resolution limit of the lithography used for generating the second opening.

34 Claims, 22 Drawing Sheets

U.S. PATENT DOCUMENTS

| | | | |
|---|---|---|---|
| 7,531,449 B2* | 5/2009 | Park et al. | 438/638 |
| 7,537,866 B2* | 5/2009 | King Liu | 430/5 |
| 7,585,722 B2 | 9/2009 | Edelstein et al. | |
| 2002/0045136 A1 | 4/2002 | Fritze et al. | |
| 2002/0187627 A1* | 12/2002 | Yuang | 438/622 |
| 2003/0199169 A1* | 10/2003 | Jun et al. | 438/694 |
| 2005/0153538 A1* | 7/2005 | Tsai et al. | 438/636 |
| 2005/0170607 A1 | 8/2005 | Hirohama et al. | |
| 2006/0175693 A1 | 8/2006 | Cady et al. | |
| 2007/0037410 A1 | 2/2007 | Chang et al. | |
| 2007/0155139 A1 | 7/2007 | Hecht et al. | |
| 2007/0158717 A1 | 7/2007 | Edelstein et al. | |
| 2008/0130200 A1 | 6/2008 | Edelstein et al. | |
| 2008/0261389 A1* | 10/2008 | Jung | 438/593 |
| 2009/0047788 A1* | 2/2009 | Jung | 438/694 |
| 2010/0035191 A1* | 2/2010 | Huang et al. | 430/323 |

FOREIGN PATENT DOCUMENTS

| | | |
|---|---|---|
| CN | 1992226 A | 7/2007 |
| CN | 101000890 A | 7/2007 |
| EP | 0 495 629 A1 | 7/1992 |
| EP | 1 156 524 A1 | 11/2001 |
| KR | 2003 0002080 | 1/2003 |
| WO | WO 00/25141 | 5/2000 |
| WO | WO 01/46716 A2 | 6/2001 |
| WO | WO 02/25373 A2 | 3/2002 |

OTHER PUBLICATIONS

Levenson, M.D., et al., "SCAA Mask Exposures and Phase Phirst Design for 110 nm and Below," Optical Microlithography XIV, Proceedings of SPIE vol. 4346, Sep. 2001, pp. 1-10, Society of Photographic Instrumentation Engineers.

Fritz, M., "Dense-only Template Lithography: Extending Existing Tools into Future Technology Nodes," Design and Process Integration for Microelectronic Manufacturing III, Proceedings of SPIE vol. 5379-05, Session 2, Feb. 2004, p. 263, Society of Photographic Instrumentation Engineers.

Shi, S.C., et al., "Forbidden Area Avoidance with Spacing Technique for Layout Optimization," Design and Process Integration for Microelectronic Manufacturing II, Proceedings of SPIE vol. 5379, May 2004, pp. 67-75, Society of Photographic Instrumentation Engineers.

Owe-Yang, D.C., et al., "Double Exposure for the Contact Layer of the 65-nm Node," Advances in Resist Technology and Processing XXII, Proceedings of SPIE vol. 5753, May 2005, pp. 171-180, Society of Photographic Instrumentation Engineers.

Lin, B.J., "Lithography for Manufacturing of sub-65nm Nodes and Beyond," 2005 IEEE International Electron Devices Meeting, IEDM Technical Digest, Dec. 5-7, 2005, pp. 48-51, IEEE.

* cited by examiner

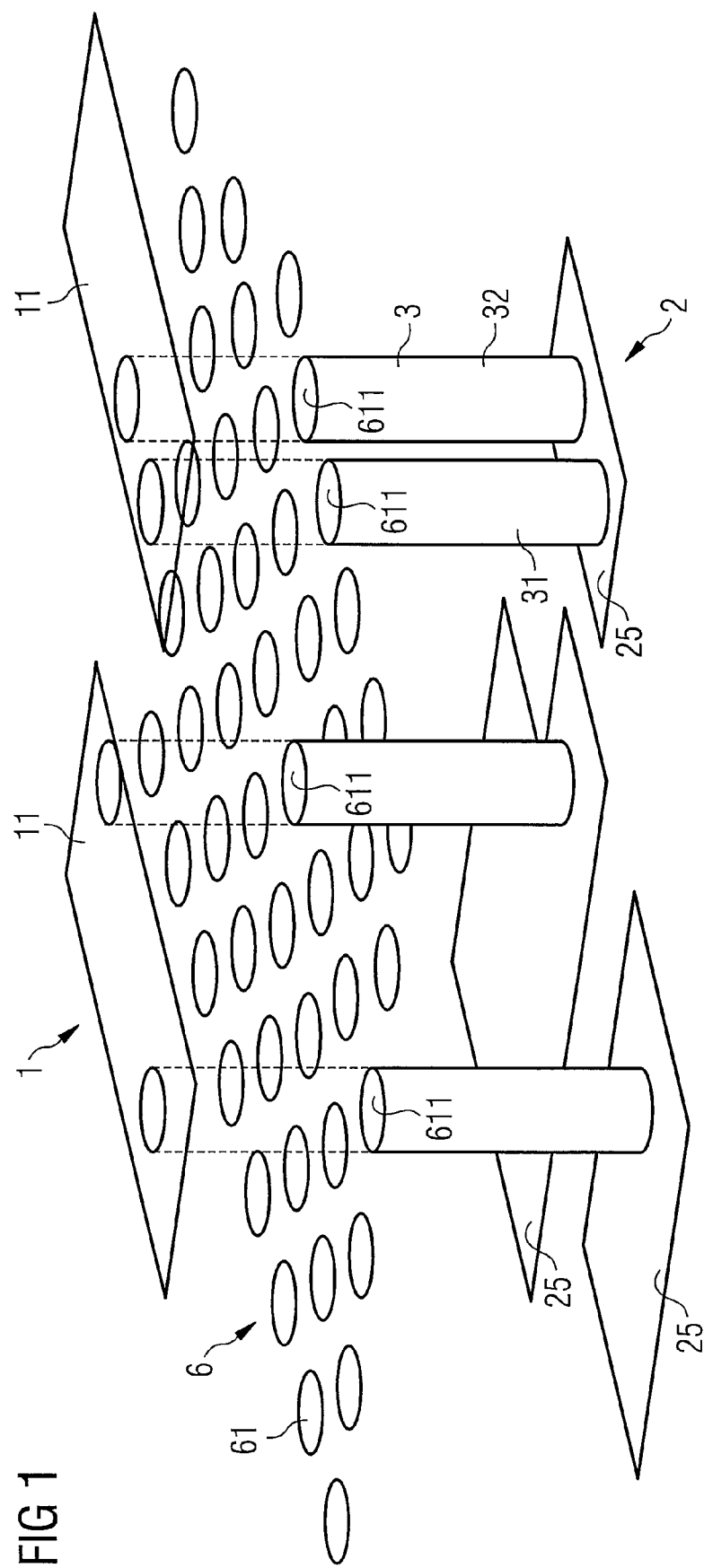

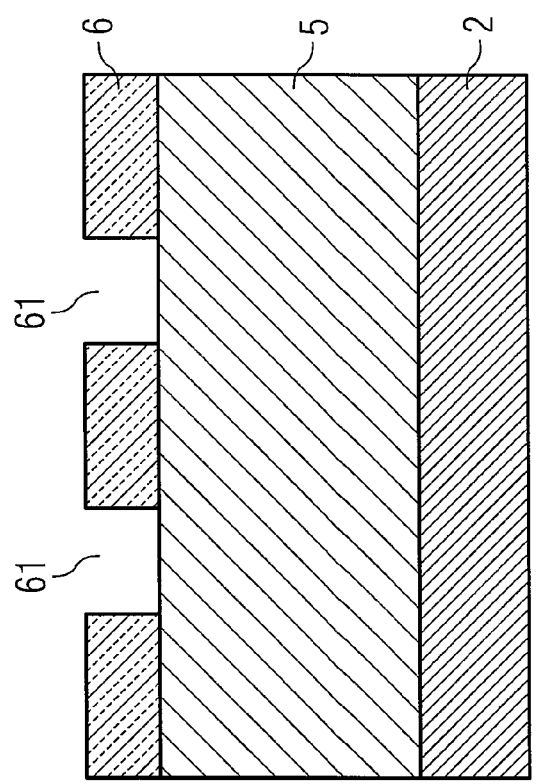
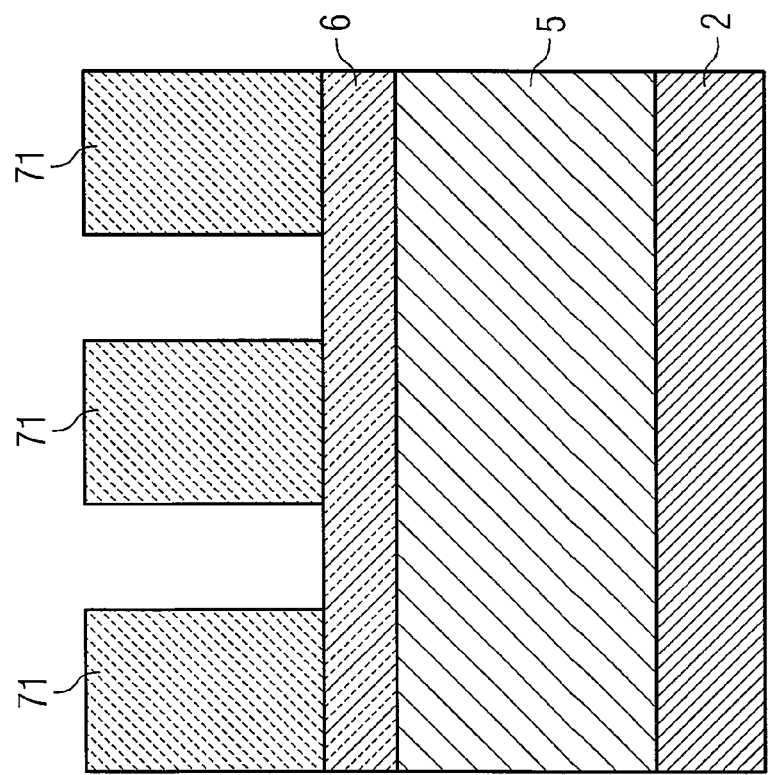

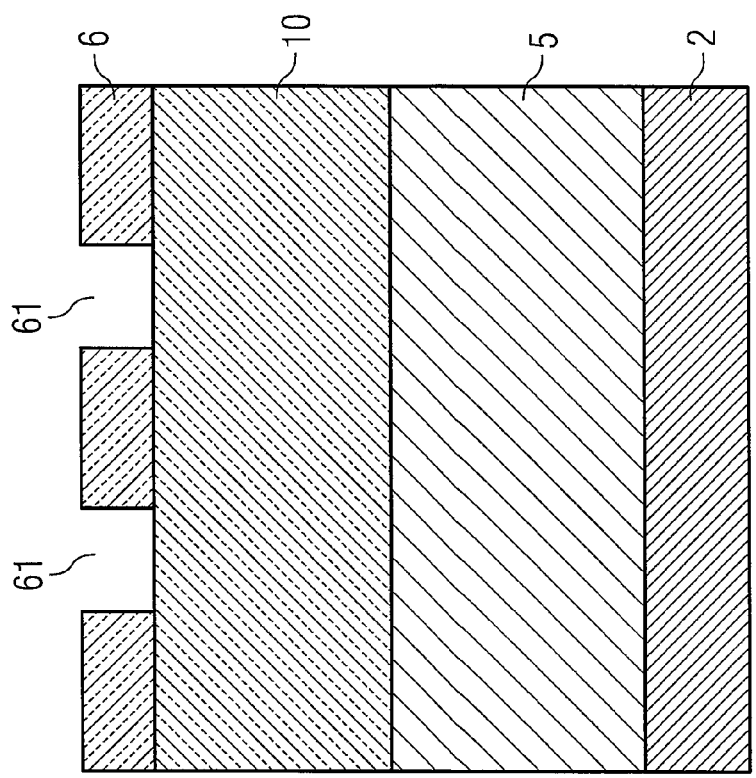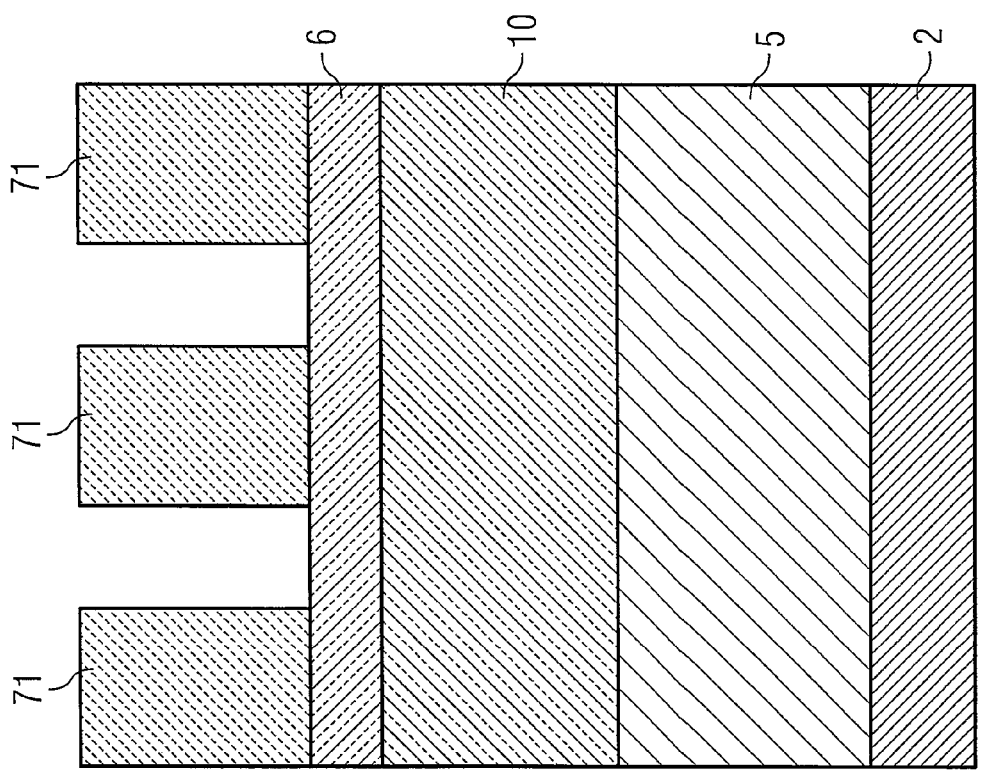

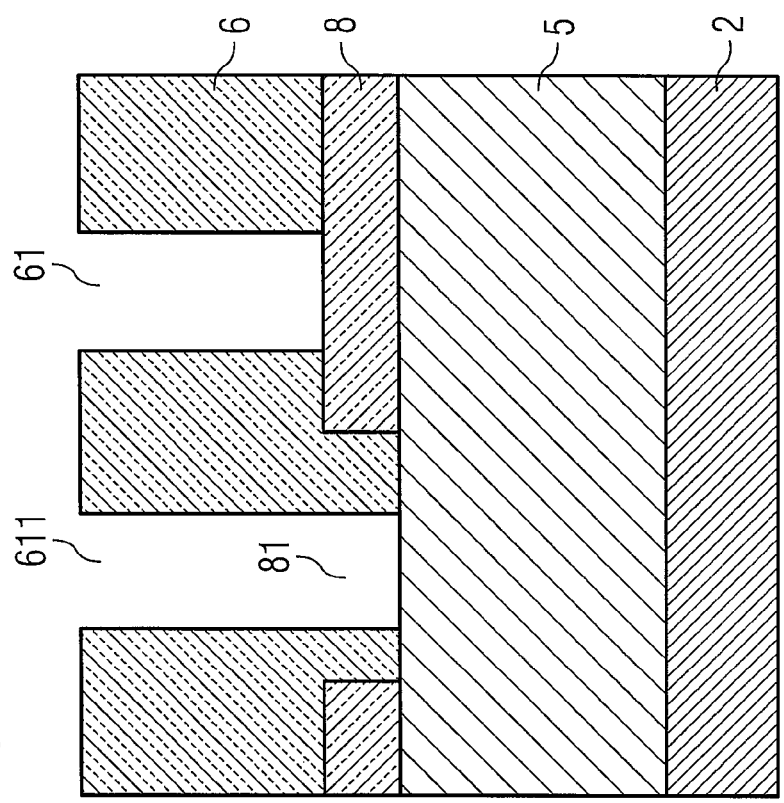
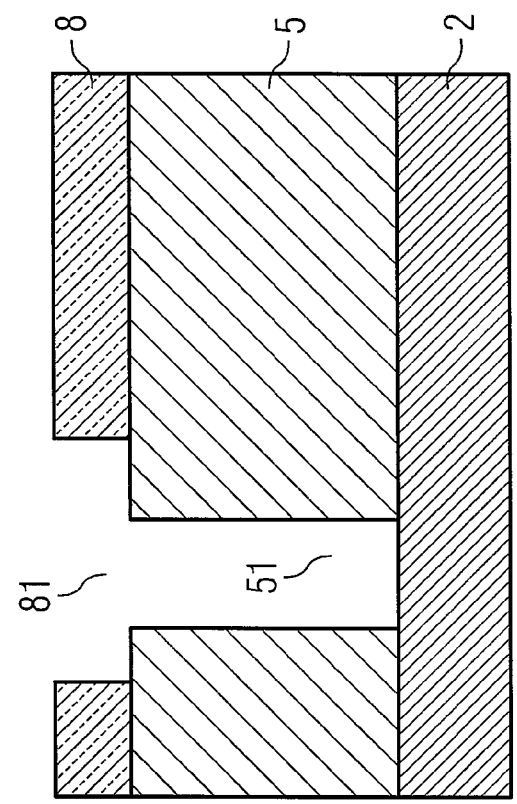

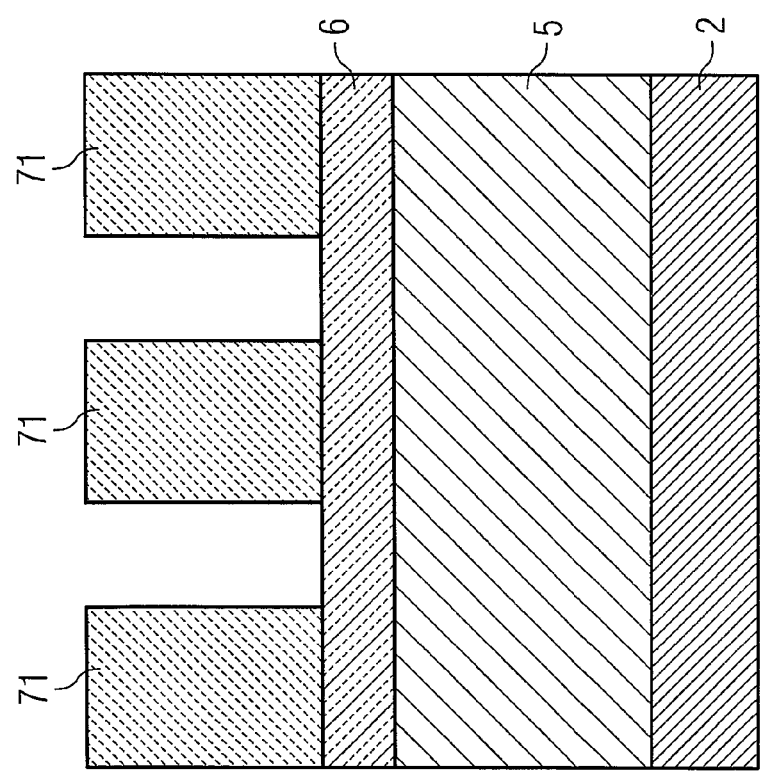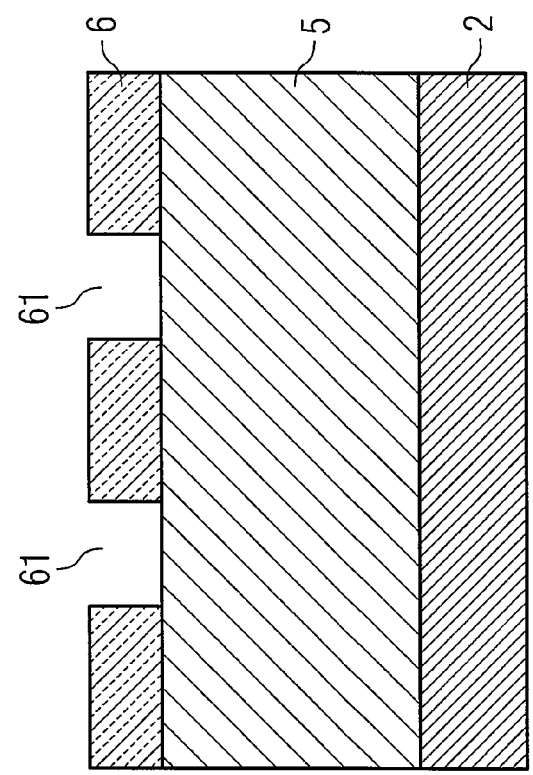

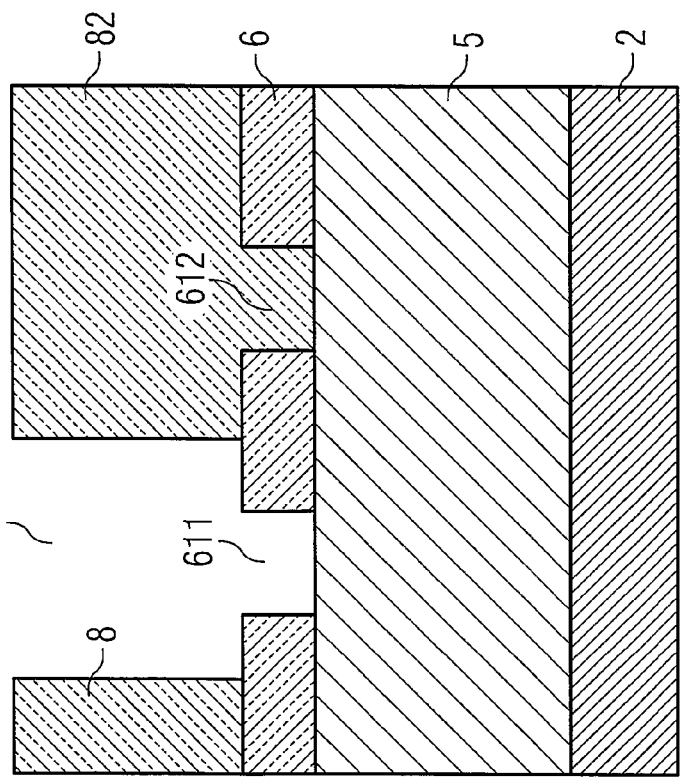
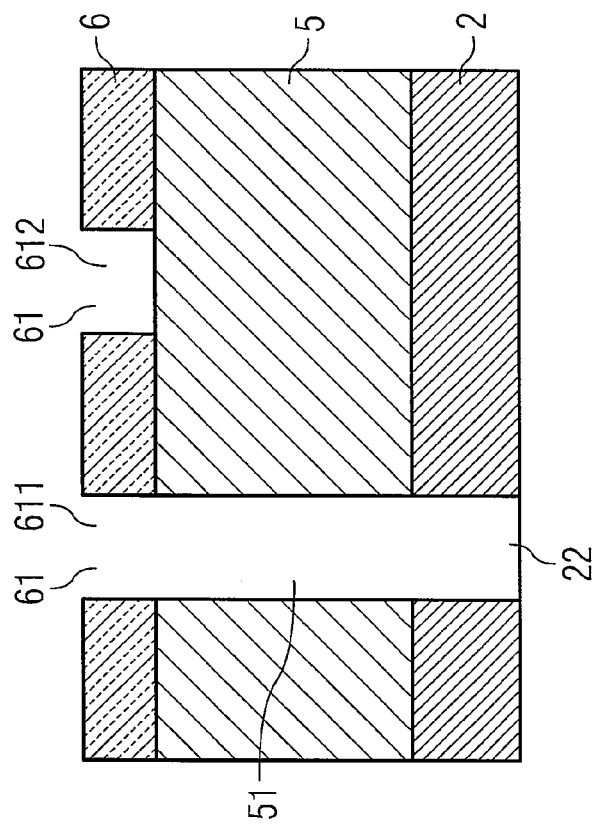

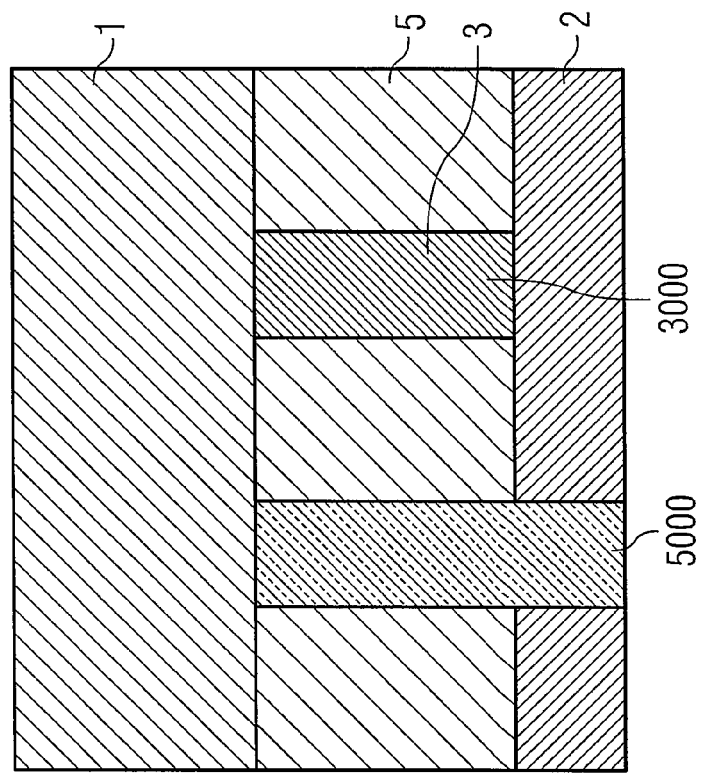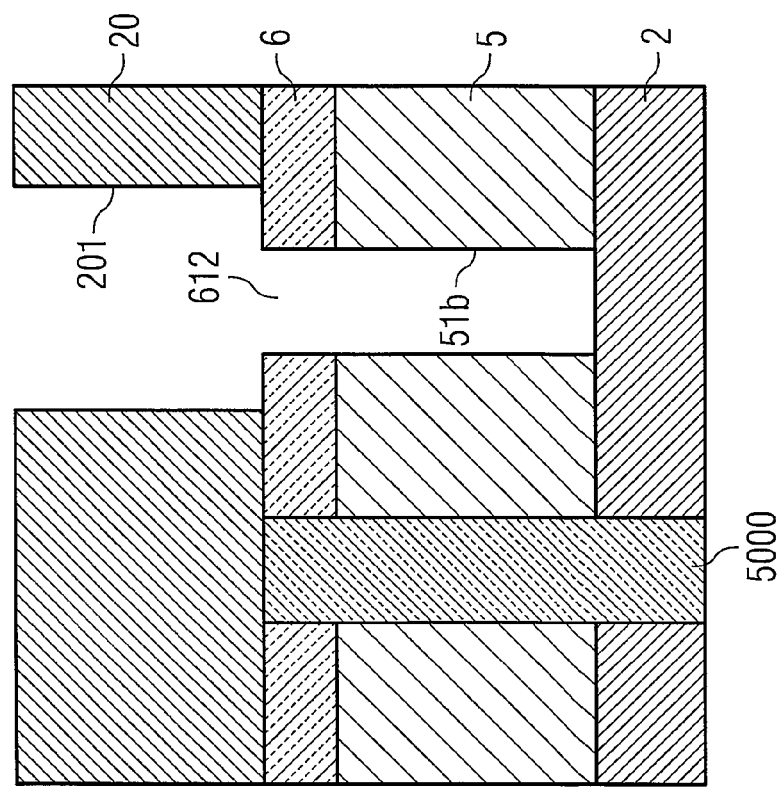

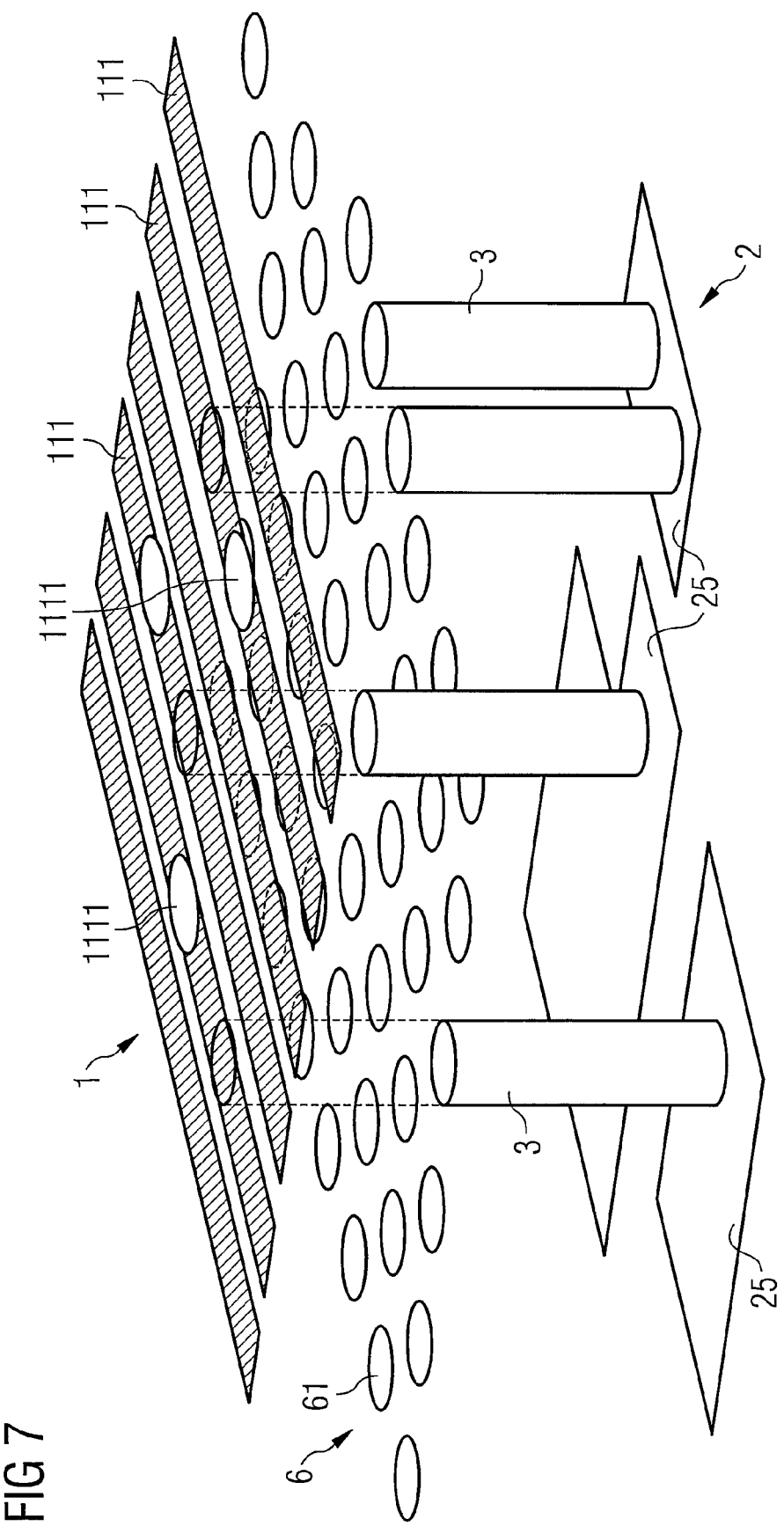

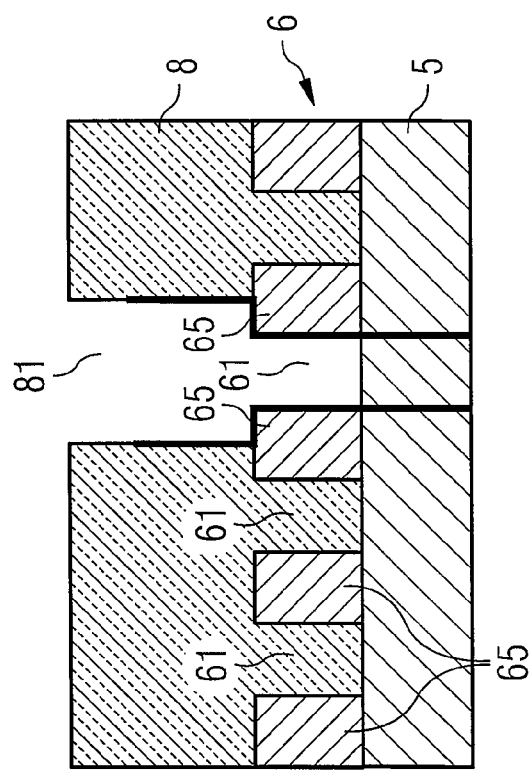
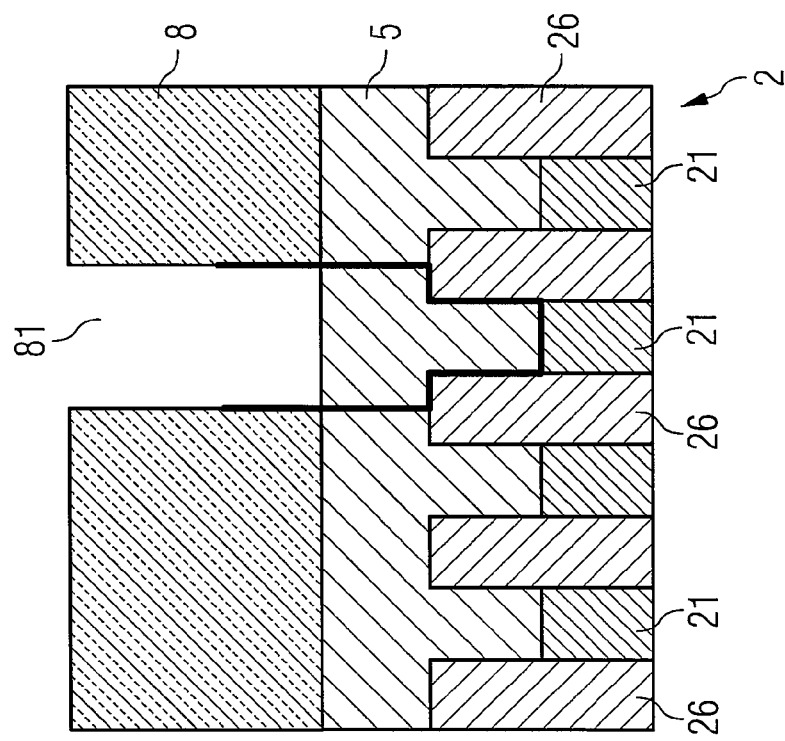
FIG 10B
FIG 10A

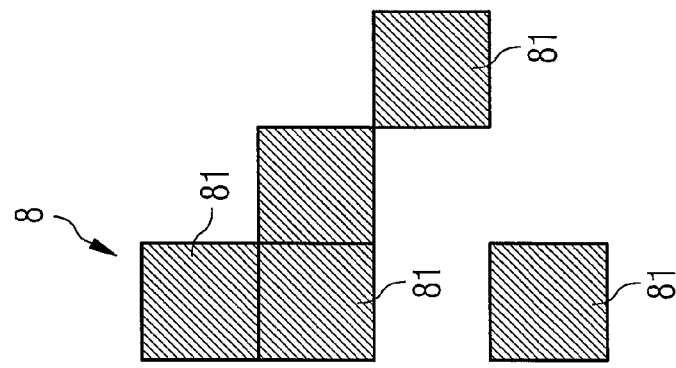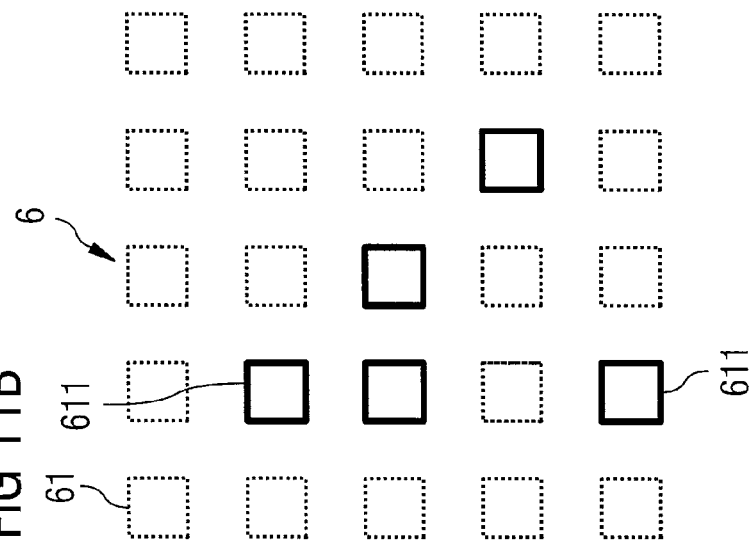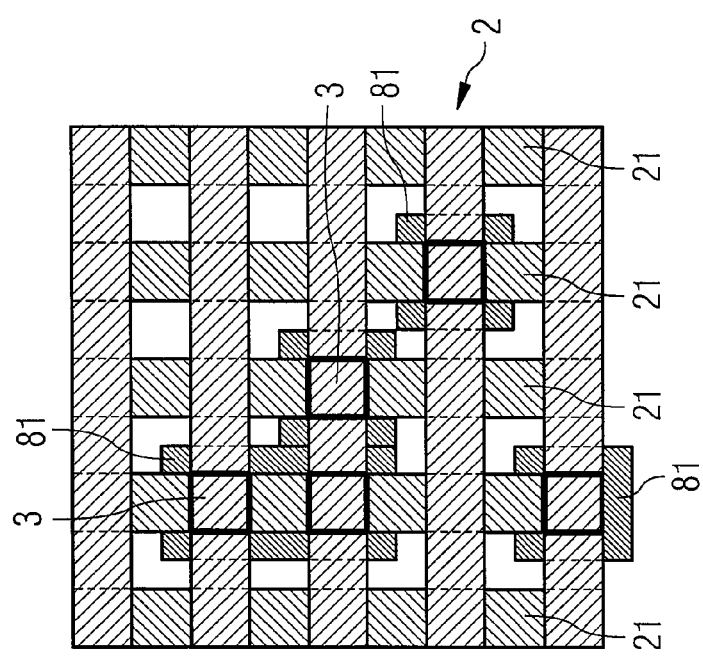

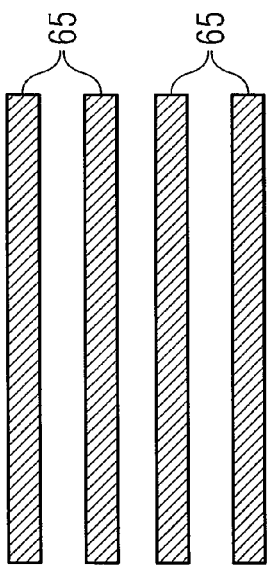
FIG 12A
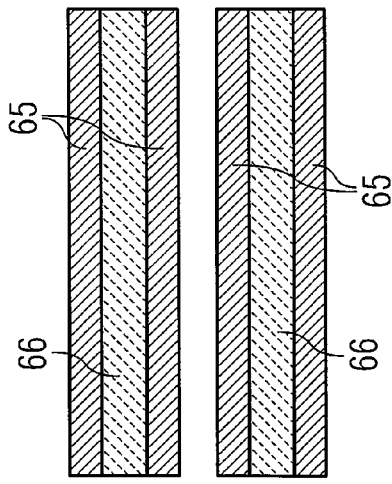
FIG 12B
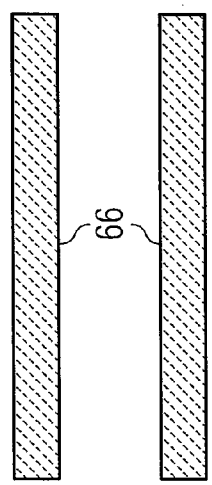
FIG 12C
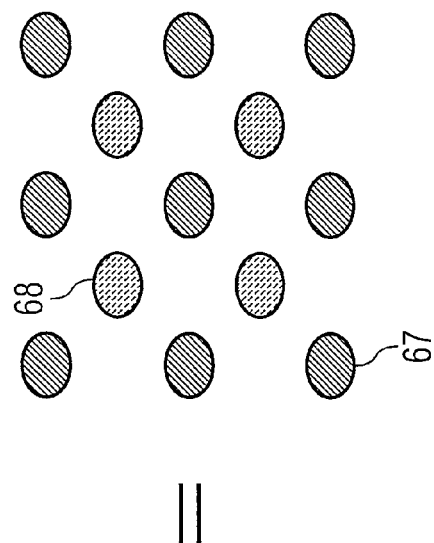
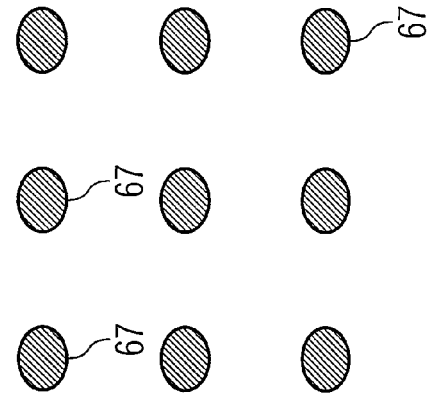
FIG 13

METHOD OF FABRICATING AN INTEGRATED CIRCUIT

BRIEF DESCRIPTION OF THE DRAWINGS

In the accompanying drawings:

FIG. 1 relates to a first embodiment of the invention;

FIGS. 2A-2F illustrate a first variant of the first embodiment;

FIGS. 3A-3D illustrate a second variant of the first embodiment;

FIGS. 4A-4D illustrate a third variant of the first embodiment;

FIGS. 6A-6H illustrate a first variant of the second embodiment;

FIG. 7 relates to a third embodiment of the invention;

FIGS. 10A and 10B further illustrate the first variant of the fourth embodiment;

FIGS. 11A-11C relate to a second variant of the fourth embodiment;

FIGS. 12A-12C illustrate a first example of generating a structure by double patterning;

FIG. 13 relates to a second example of generating a structure by double patterning;

DETAILED DESCRIPTION OF ILLUSTRATIVE EMBODIMENTS

Figure 2C:
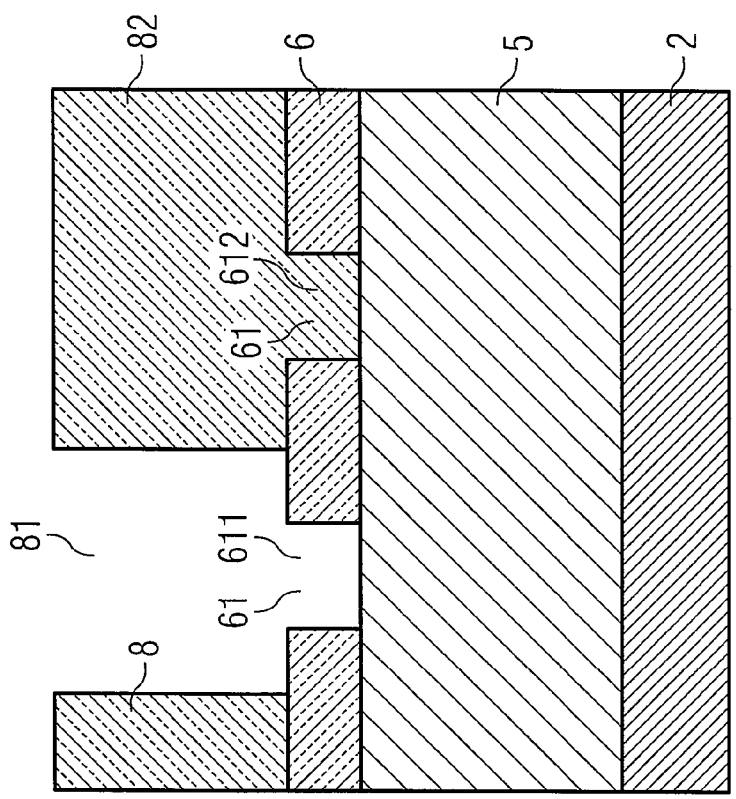

FIG. 1 relates to a method of fabricating an integrated circuit according to a first embodiment of the invention. An integrated circuit comprises a structured upper layer 1 comprising structures 11 and a lower layer 2 comprising structures 25. A plurality of connecting structures in the form of contacts 3 is arranged between the lower layer 2 and the upper layer 1 which electrically connect the structures 25 of the lower layer 2 with the structures 11 of the upper layer 1. However, the connecting structures can have functions other than providing an electrical connection between the lower and the upper layer. Therefore, in another example, the connecting structures consist of a non-conductive material. Further, the connecting structures can extend beyond the lower and the upper layer, respectively, in order to connect to additional layers (not shown).

Upper layer 1 and lower layer 2 have been fabricated using standard lithography such that both the structures 11 and 25 of the upper layer 1 and the lower layer 2 are produced with standard resolution. Among the plurality of contacts 3, however, at least two neighboring contacts 31 and 32 exist that are spaced from one another with a distance below the lithographic resolution limit (sub-lithographic). For generating the sub-lithographic contacts 3 a first mask 6 with a regular, grid-like pattern of first openings (holes) 61 was produced using a double patterning technique. A second mask (not shown) with standard resolution was used in addition to the first mask, wherein the second mask is used to cover some of the first openings 61 and to select some (four openings 611 in the example of FIG. 1) of the openings 61. The contacts 3 are produced in the region of the selected openings 611.

Although the first openings are shown to be circular holes, the invention is not restricted to a particular geometry of the first openings or of the openings of the second mask layer. For example, also non-circular holes or longitudinal openings can be provided.

Using a combination of a first mask containing a pattern of sub-resolution first openings and a selection mask with standard resolution (produced by standard lithography) for selecting a subset of the first openings permits the fabrication of an arbitrary layout containing sub-resolution features. A first variant of the first embodiment will be explained in greater detail with respect to FIGS. 2A to 2F.

It is noted that the lower layer 2 in principle can be any kind of layer, e.g., a metallization plane (which, e.g., provides a connection to gates of a plurality of transistors) or a region (of, e.g., a semiconductor substrate) comprising active areas of the integrated circuit. The upper layer 1, e.g., can be a contact plane (metallization plane) or any other kind of layer, e.g., comprising doped materials, metals, poly silicon or titanium nitride (TiN). Further, the first openings 61 do not necessarily have to be arranged in a grid. They can be arranged in any kind of (sub-lithographic) pattern depending on the desired application. In another example the first openings are arranged in a plurality of mini-arrays, wherein the mini-arrays do not necessarily have to be aligned to each other.

Referring to FIGS. 2A to 2F, a first mask layer 6 is formed on a further layer 5 (which is, e.g., formed as a hard mask layer comprising, e.g., silicon oxide or any other materials suited as hard mask material). The further layer 5 in turn is arranged on a lower layer in the form of a lower wiring layer 2.

The first mask layer 6 is structured using a mask comprising sub-lithographic structures 71 formed by a double patterning process, i.e., the pitch of the structures 71 is lower than a pitch that can be achieved by a standard (single) lithography step. Multiple variants of double patterning techniques exist, e.g., double exposure, spacer mask techniques (e.g., pitch fragmentation), heterogeneous mask techniques and intermediate pattern accumulation. These techniques, however, are well known in the art and are thus not explained in greater detail. Examples of double patterning methods are illustrated in FIGS. 12A, 12B, 13, 14A-14B, 15A-15C and 16A-16D. In an example, the pitch of the structures is smaller than the resolution limit of lithography at a wavelength of approximately 193 nm, e.g., smaller than approximately 40 nm.

Using the mask, first openings 61 are created in the first mask layer 6, wherein at least two neighboring openings 61 are spaced from each other with a distance below the standard lithography resolution (FIG. 2B). The first openings 61 define possible positions of connecting structures.

On the structured mask layer 6 a second mask layer (selection mask) 8 is created (FIG. 2C) comprising at least one second opening 81 that uncovers one of the first opening 61 (the opening 611) and covers another first opening 612 with a portion 82. The second mask layer 8 thus is used to select one or a plurality of the first openings 61 which shall be used for creating a connecting structure (e.g., contacts). Of course, the second mask can comprise more than one second opening in order to select more than one first opening.

The second opening 81 is generated using standard (single) exposure) lithography, i.e., with standard resolution. In one example, layer 8 consists of a resist and is directly structured by a lithography step. In another example layer 8 is a hard mask which is structured using a resist on top which in turn is structured by standard lithography. Thus, a standard mask (the second mask) is used to select some of the first openings 61, wherein at least two neighboring first openings are spaced from another with a distance below the lithographical limit of the lithography step used for fabricating the at least one second opening or the plurality of second openings.

Figure 2D:
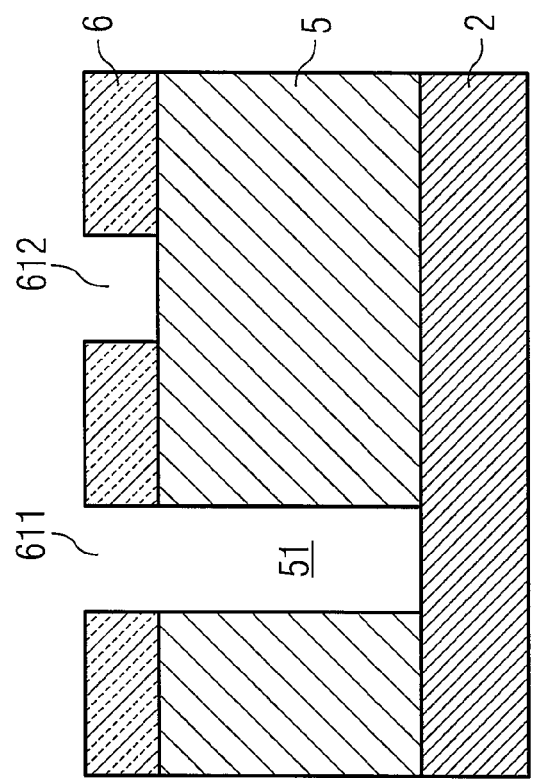

According to FIG. 2D the further layer 5 is etched using the first and the second mask layer 6, 8 (i.e., the selected first opening 611 and the second opening 81) such that an opening 51 is generated in the further layer 5 comprising the lateral dimensions of the sub-lithographic openings 61. The opening 51 in the further layer 5 uncovers the lower layer 2 in the region of the second and the selected first opening 611. After generating the opening 51 the second layer 8 and the first layer 6 are removed (FIG. 2E).

Figure 2F:
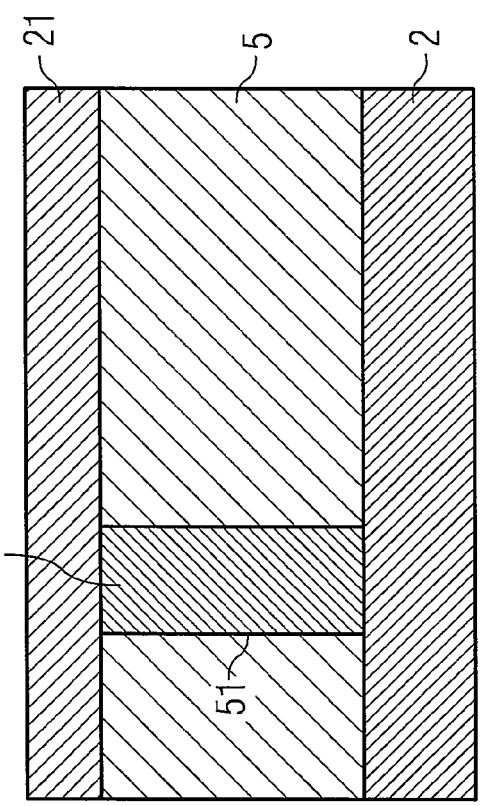
Figure 2E:
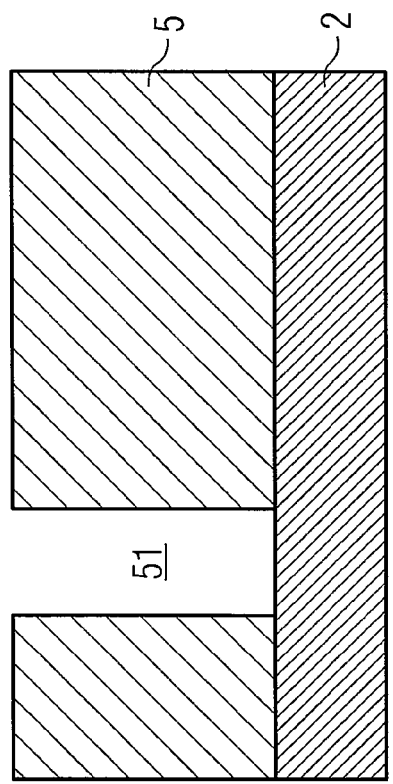

In a further step, as illustrated in FIG. 2F, the opening 51 in the further layer 5 is filled with a material, e.g., a conductive material such as a metal or a doped material such as poly silicon, such that a connecting structure in the form of a contact 3 is formed. Further, an upper layer in the form of an upper wiring layer 21 is generated, wherein the upper wiring layer 21 is connected to the lower wiring layer 2 via the contact 3 formed within the opening 51.

Referring to FIGS. 3A to 3D. These figures relate to a further variant of the first embodiment, wherein an additional hard mask layer in the form of carbon layer 10 is generated on the further layer 5. The first mask layer 6 is generated on the additional carbon layer 10 and structured such that sub-lithographic openings 61 are created as described above with respect to the FIGS. 2A to 2F.

Figure 3C:
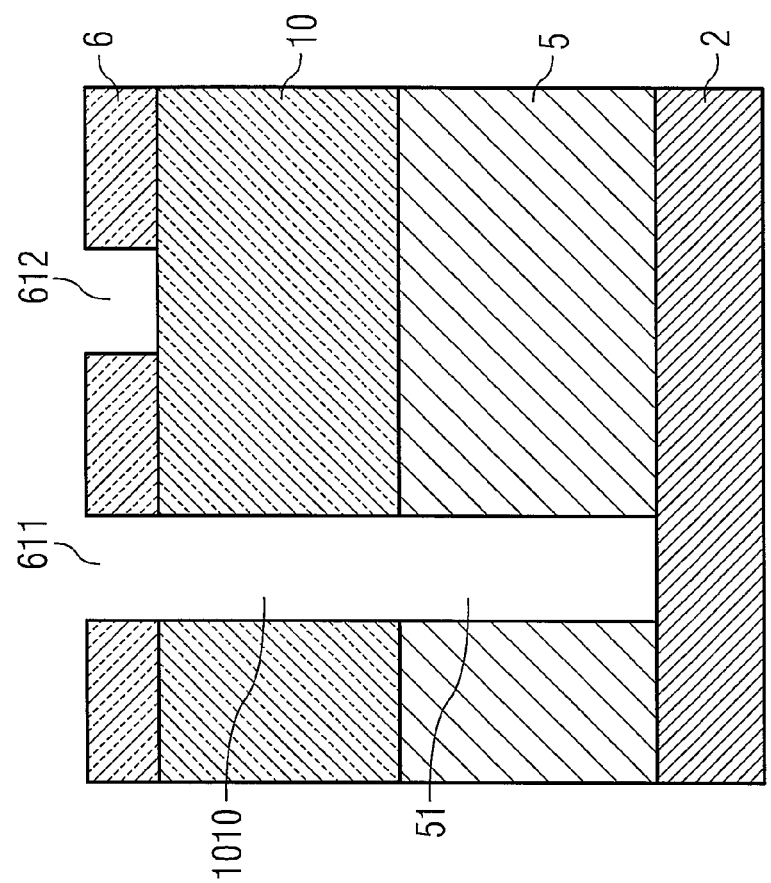
Figure 3D:
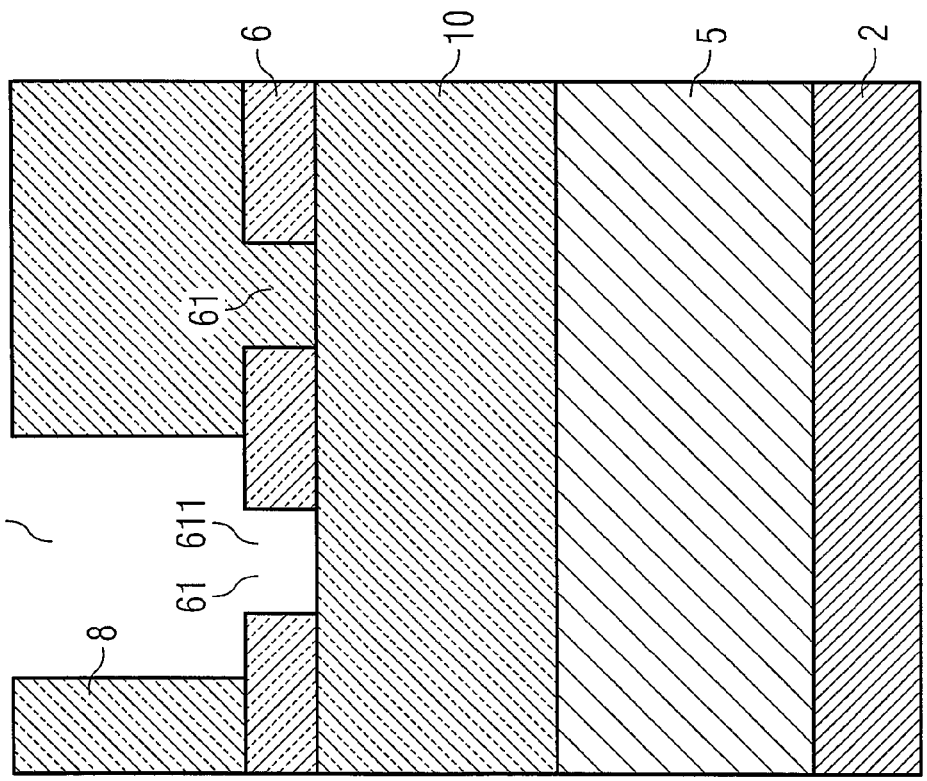

The second mask layer 8 comprising the second opening 81 is generated in order to select one (opening 611) of the first openings 61 (FIG. 3C). An etching step is then performed using the selected opening 611 such that an opening 1010 is formed (FIG. 3D) in the carbon layer 10 and an opening 51 is formed in the further layer 5 which is aligned with the opening 1010. The lower layer 2 is uncovered through the openings 1010 and 51 in the region of the selected first opening 611 such that a connecting structure to the lower layer 2 can be formed by filling both the opening 1010 and 51 by a material, e.g., a conductive material. In an example, the filling of the openings 1010 and 51 is carried out in one step with the generation of the upper layer (not shown) that is then connected to the lower layer 2 via the at least one connecting structure. In another example, the carbon layer 10 and the first mask layer 6 are removed before the opening 51 is filled.

Figure 4B:
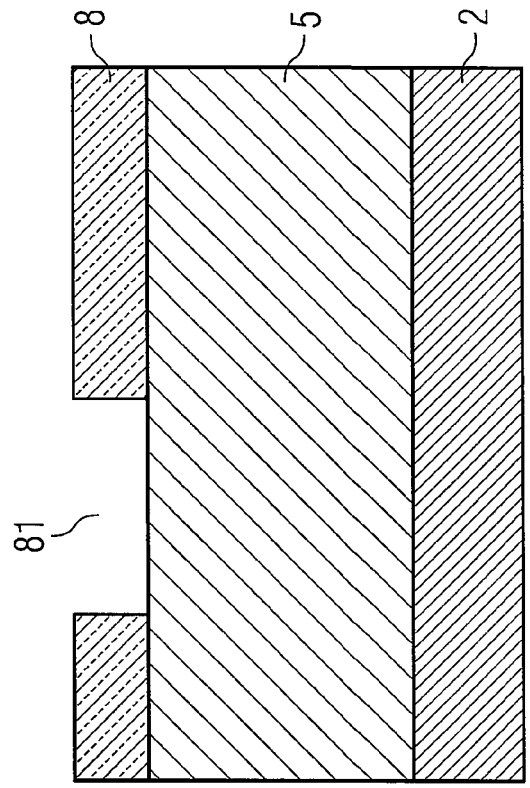
Figure 4A:
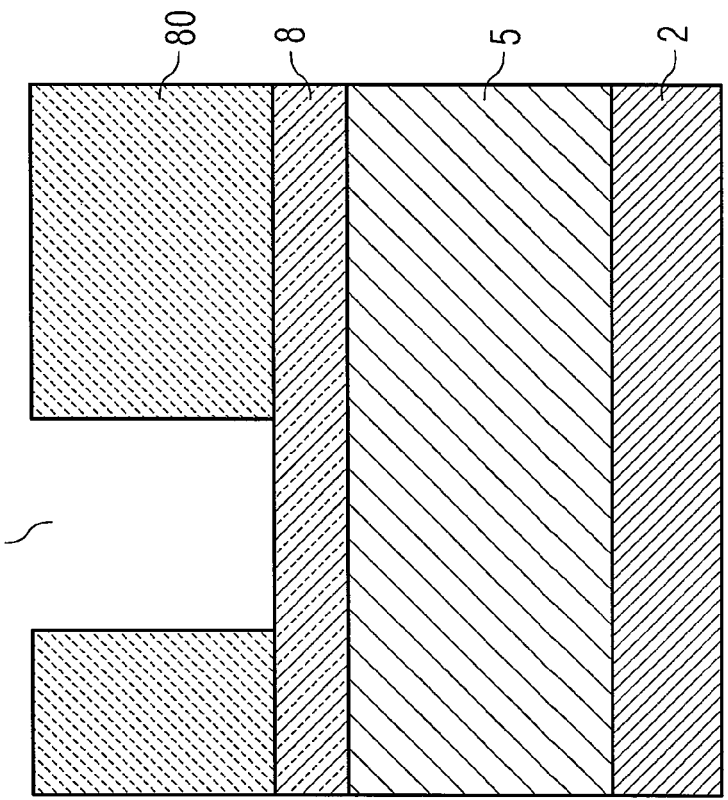

FIGS. 4A to 4D refer to yet a further variant of the first embodiment. Similar to the previous variants a lower layer 2 and a further layer 5 are generated. In contrast to the previous variants, however, the second mask layer 8 is generated directly on the further layer 5, the second mask layer being structured using single exposure lithography. For this, a resist mask 80 is deposited on the second mask layer 8 and structured such that an opening 801 is created which is subsequently transferred into the second mask layer 8 (e.g., by dry or wet etching). After forming the second opening 81 the resist layer 80 is removed (FIG. 4B).

According to FIG. 4C the first mask layer 6 comprising a plurality of openings 61 with sub-lithographic resolution (generated by double patterning) is created on the second mask layer 8 such that one of the openings 61 (opening 611) overlaps with the second opening 81 of the second mask layer 8. As is clear by comparing the variant of FIGS. 2A to 2F to the variant of FIGS. 4A to 4D the order of arranging the first and the second mask layer can be changed, i.e., the second mask layer can be arranged on the first mask layer or vice versa.

According to FIG. 4D the first opening 61 aligned with the second opening 81 is again used to etch the underlying further layer 5 such that an opening 51 is created in layer 5 uncovering the lower layer 2 in the region of the selected first opening 611.

Figure 5:
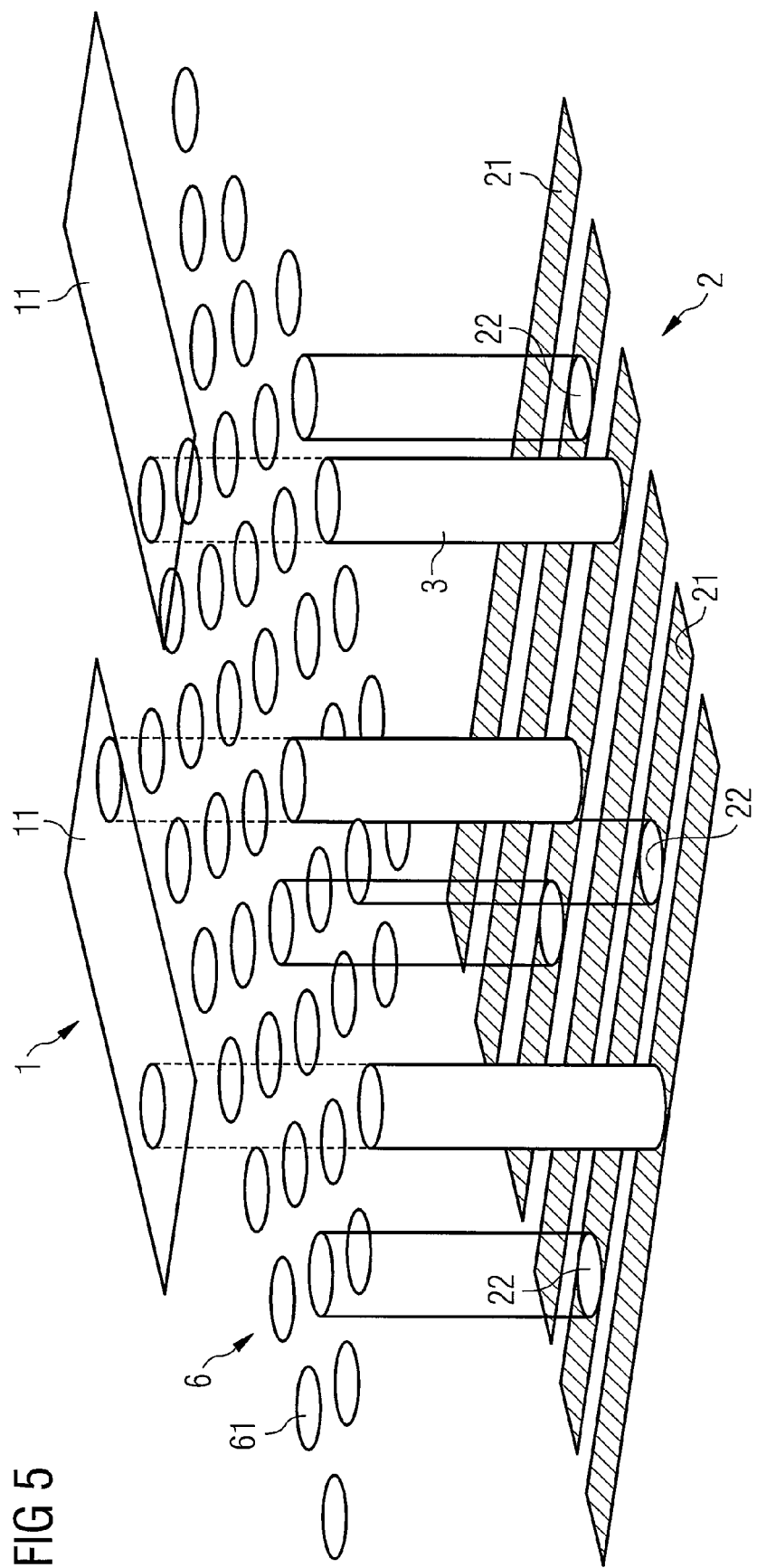
FIG. 5 relates to a second embodiment of the invention.

FIG. 5 relates to a second embodiment of the invention. An integrated circuit comprises an upper layer 1 and a lower layer 2, wherein the lower layer 2 and the upper layer 1 are connected by a plurality of connecting structures in the form of contacts 3. Insofar the integrated circuit of FIG. 5 resembles the integrated circuit of FIG. 1. However, in contrast to FIG. 1 the lower layer 2 comprises sub-lithographic longitudinal structures 21. The sub-lithographic structures 21 are, e.g., formed by a double patterning process. The upper layer 1, however, comprises structures 11 with standard resolution, i.e., which are generated using standard lithography.

Further, the longitudinal structures 21 comprise interrupting sections 22. Both the contacts 3 and the interrupting sections 22 are fabricated using a sub-lithographic mask 6 which comprises a plurality of grid-like arranged openings 61 in combination with a selection mask (not shown).

Figure 6F:
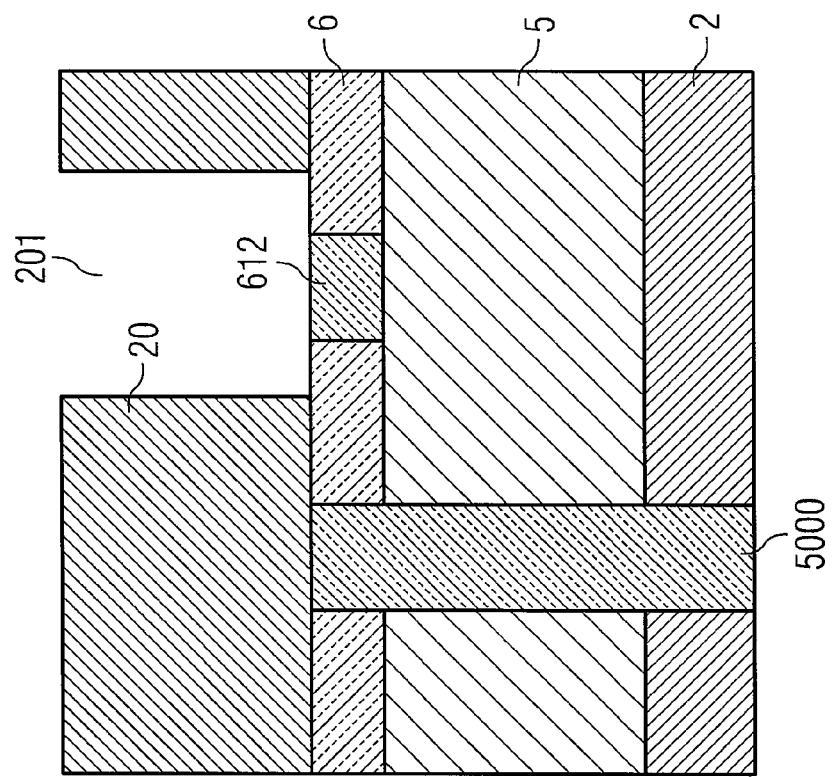

FIGS. 6A to 6H relate to a first variant of the second embodiment. A further layer 5 is formed on a lower layer 2 as in the previous variants. Also similar to the previous variants (of the first embodiment) a plurality of sub-lithographic first openings 61 is formed within the first mask layer 6 (FIG. 6B). After forming the openings 61 a second mask layer in the form of a selection mask 8 is generated, the second mask layer 8 having a second opening uncovering (selecting) one of the openings 61 (opening 611) and covering another one of the first openings 61 (opening 612) (FIG. 6C). Through the uncovered opening 611 both the further layer 5 and the lower layer 2 are etched (FIG. 6D) such that an opening 51 in the further layer 5 and an interrupting section 22 in the lower wiring layer 2 is generated, wherein the interrupting section 22 is aligned with the selected first opening 611.

Figure 6E:
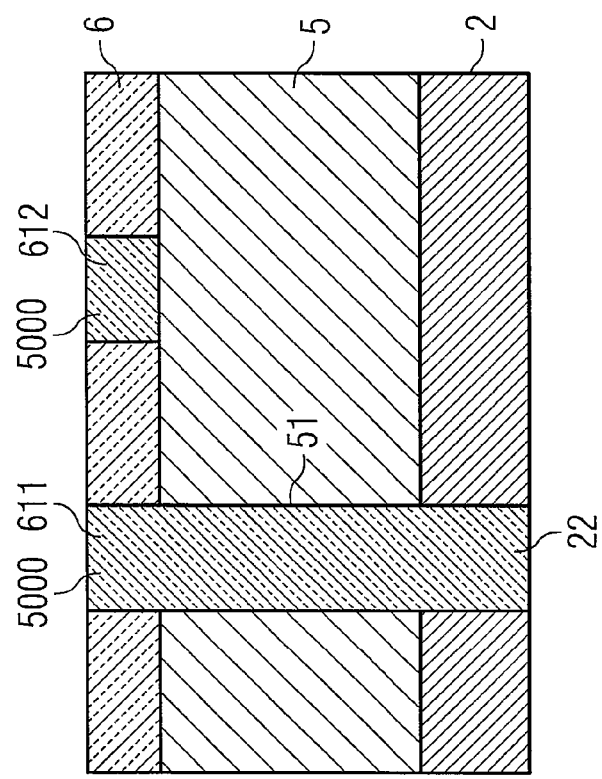

As shown in FIG. 6E, after removing the second mask layer 8 the openings 611, 51 and the interrupting section 22 of layer 2 are filled with a material 5000 such as a non-conductive material, e.g., silicon oxide.

Subsequently, a new mask layer 20 is arranged on the first mask layer 6, the new mask layer 20 having an opening 201 uncovering the opening 612 which were covered by the second mask layer 8 (FIG. 6F). In other words the new mask layer 20 is a further selection mask for selecting one or more first openings which were not selected by the (first) selection mask 8. Similar to the first selection mask 8 (the second mask layer) the openings in the new mask layer 20 are generated using standard lithography.

An etching step is performed using mask 20 such that the filling material 5000 is removed from the opening 61 and an opening 51*b* is generated in layer 5 aligned with opening 612 (FIG. 6G).

According to FIG. 6H, opening 51*b* is filled with a conductive material 3000 such that a contact 3 is formed within the opening 51*b*. On top of the further layer 5 an upper layer in the form of a conductive layer 1 is deposited, wherein the conductive layer 1 is connected to the lower wiring layer 2 via the contact 3. In an example, the generation of the conductive layer 1 is done in one step with the filling of the opening 51*b* such that the contact 3 and the conductive layer 1 comprise the same conductive material.

Referring to FIG. 7, a third embodiment of the invention is illustrated. A integrated circuit resembling the device of FIG. 5 comprises an upper layer 1 having a plurality of parallel longitudinal structures 111. The structures 111 are fabricated using a double patterning technique such that the distance between at least two neighboring structures 111 is below the lithographical limit.

The lower layer 2 comprises structures 25 that are generated by standard lithography, i.e., with standard resolution. As in the second embodiment (FIG. 5) the lower layer 2 is connected to the upper layer 1 via a plurality of contacts 3, wherein at least two neighboring contacts 3 have a distance smaller than the standard lithographic resolution, wherein the contacts are also formed by a double patterning process. For this, a first mask 6 is used having a grid of openings 61 together with a selection mask (not shown).

The longitudinal structures 111 of the upper layer 1 can have interrupting sections 1111, e.g., formed by the double patterning method using a mask with a grid of openings like the mask 6.

Figure 8:
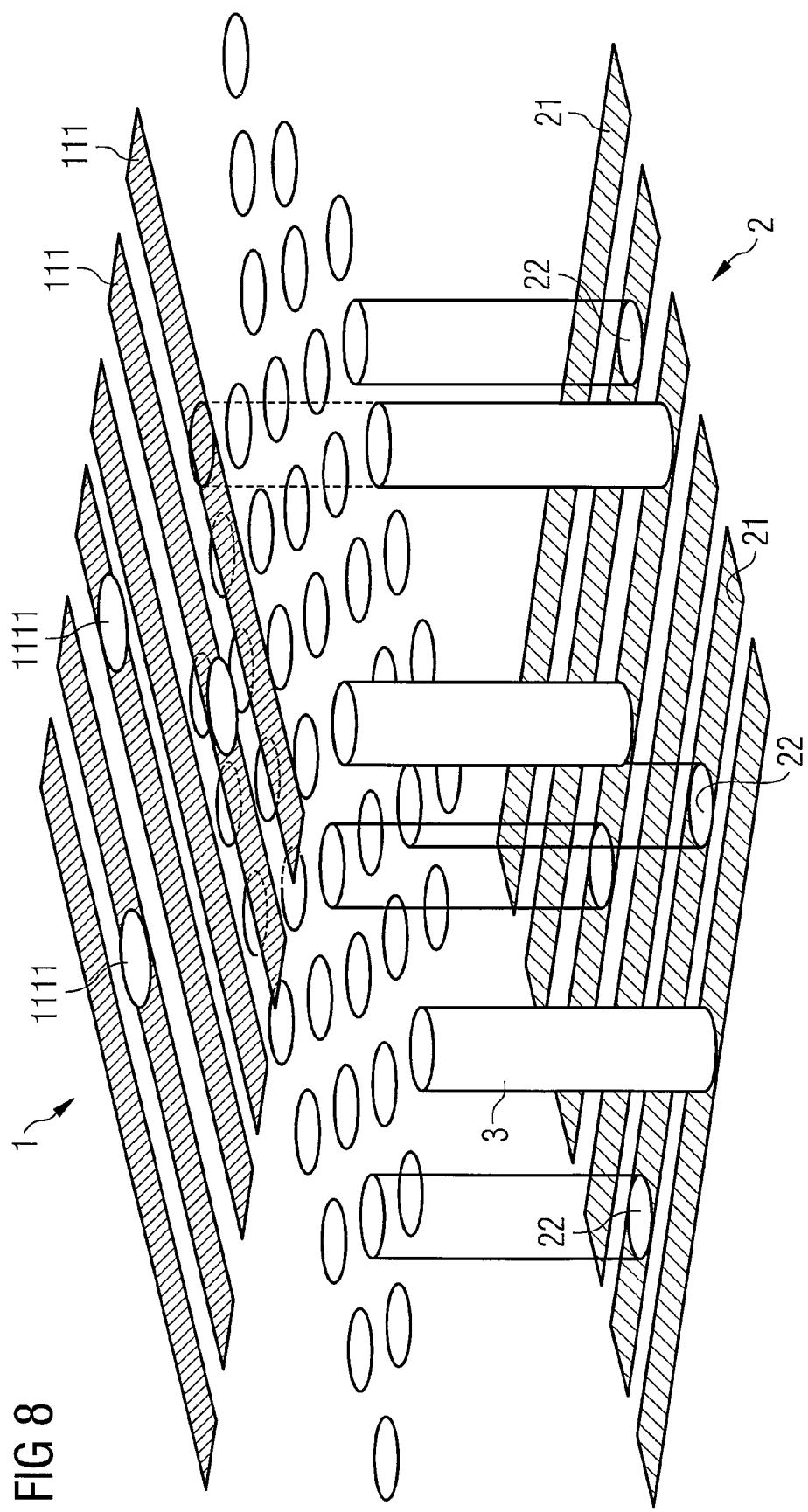
FIG. 8 relates to a fourth embodiment of the invention.

A fourth embodiment of the invention is illustrated in FIG. 8. The resulting structure resembles a combination of the structures shown in FIGS. 5 and 7. Both the top layer 1 and the lower layer 2 comprises a plurality of parallel longitudinal structures 111 and 21, respectively, wherein the lower layer 1 and the upper layer 2 are structured using a double patterning process such that the layer 1 and 2 are structured with a resolution below the standard resolution.

As in FIGS. 5 and 7 between the upper layer 1 and the lower layer 2 a plurality of contacts 3 are formed with sub-lithographic resolution. For this, again, a first mask 6 comprising a plurality of openings 61 in combination with a selection mask (not shown) is used.

Figure 9:
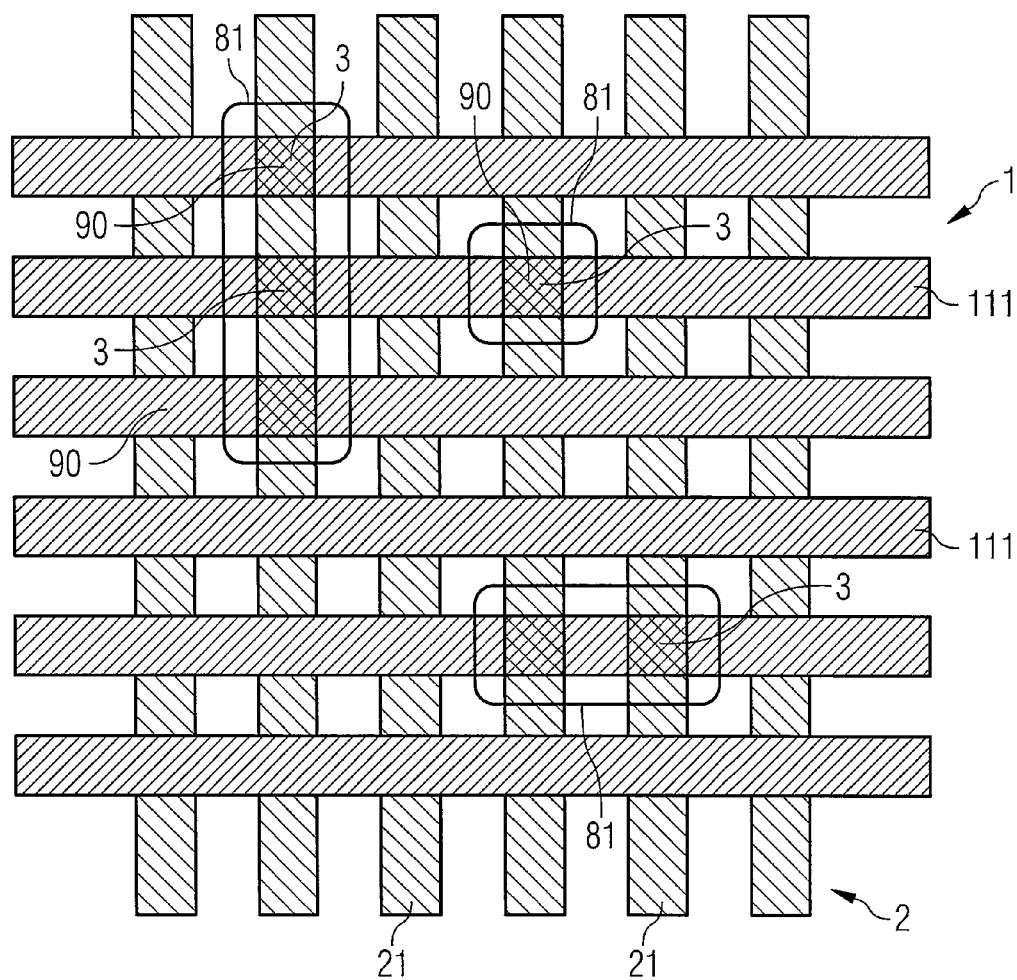
FIG. 9 relates to a first variant of the fourth embodiment.

Referring to FIG. 9 a variant of the fourth embodiment is illustrated. An integrated circuit comprises a lower layer 2 having a plurality of first longitudinal structures in the form of parallel conductive lines 21. Further, a plurality of second longitudinal structures in the form of second contact lines 111 of an upper layer 2 is arranged perpendicular to the conductive lines 21. In this example both the conductive line 21 of the lower layer 2 and the conductive lines 111 of the upper layer 1 are fabricated using a double patterning process, i.e., with sub-lithographic resolution. However, an embodiment of the invention includes the variant that only the lower or the upper longitudinal structures are generated with sub-lithographic resolution. In another example, both the lower and the upper longitudinal structures are generated with standard resolution.

Overlapping regions 90 exist, where the lower conductive lines 21 and the upper conductive lines 111 overlap. In some of the overlapping regions 90 contacts 3 are formed connecting an upper conductive line 111 with a lower conductive line 21. The contacts 3 were produced using a grid-like sub-lithographic mask and a selection mask having openings 81, wherein the selection mask is generated with standard resolution.

Referring to FIGS. 10A and 10B, the variant of FIG. 9 is explained in greater detail, wherein FIG. 10A is a sectional view perpendicular to the conductive lines 21 and FIG. 10B is a sectional view parallel to the conductive lines 21. A lower layer 2 comprises a plurality of longitudinal structures in the form of conductive lines 21. The conductive lines 21 are separated by a plurality of spacer structures 26 (e.g., comprising a non-conductive material such as silicon nitride). A further layer 5 (e.g., comprising a non-conductive material such as silicon oxide) is arranged over the lower layer 2, wherein the spacers 26 protrude into the layer 5. This, however, is not obligatory, the height of the spacers 26 can also equal the height of the layer 2.

On top of the further layer 5 a second mask layer in the form a selection mask 8 is arranged comprising at least one second opening 81. As shown in FIG. 10B, a first mask layer 6 comprising a plurality of first openings in the form of the longitudinal openings 61 is created on the further layer 5, wherein the openings 61 are defined by a plurality of upper structures 65 and run perpendicular to the lower conductive lines 21. Thus, the longitudinal openings 61 overlap with the lower conductive lines 21 such that the overlapping regions 90 (shown in FIG. 9) are created. FIG. 10B also shows that the second opening 81 of the second mask layer 8 uncovers (selects) a portion of one of the longitudinal openings 61 and covers the first mask layer 6 outside the second opening 81.

Using the second mask layer 8 an etching step is performed such that an opening is created in the further layer 5 such that the lower layer 2 is uncovered in the region of the overlapping regions 90.

After the etching step the opening in the further layer can be filled with a (e.g., conductive) material in order to form a connecting structure to the lower layer 2. Also, after removal of the second mask layer 8, the longitudinal first openings 61 are filled with the material of the connecting structure or some other kind of material in order to form the upper conductive lines 111 spaced from each other by the spacer structures 65. Thus, the contact formed in the further layer electrically connects one of the upper conductive lines 111 to one of the lower conductive lines 21.

Referring to FIGS. 11A to 11C, another variant of the fourth embodiment is illustrated. As shown in FIG. 11A, a lower layer 2 comprising structures in the form of a plurality of parallel lower longitudinal structures 21 is generated, wherein the width F of the structures 21 and the distance between two neighboring structures is F (F: minimal feature size), i.e., at the resolution limit of standard lithography.

In order to form a plurality of connecting structures 3 to the longitudinal structures 21 a first mask layer 6 comprising a plurality of rectangularly shaped openings arranged on a grid, i.e. in a row and column pattern, is provided (FIG. 11B).

Since connecting structures shall not be formed at every location of the first openings 61 a selection mask 8 (second mask layer) is fabricated that comprises a plurality of second openings 81 (FIG. 11C) having standard resolution dimensions, i.e., a width and a distance to each other of at least 2F. Using the selection mask 8 a number of first openings 611 is uncovered defining locations of desired connecting structures. The selected first openings 611 are indicated by continuous lines in FIG. 11B.

FIGS. 12A to 12C and 13 relate to two different double patterning methods. As shown in FIG. 12A, a plurality of first structures in the form of longitudinal carrier structures 66 is formed and a plurality of second structures in the form of spacer structures 65 are created adjacent to the carrier structures 66 (FIG. 12B). Subsequently, the carrier structures 66 are removed, e.g., by selective etching, such that the spacer structures 65 are left, only, and the first openings are formed between the spacer structures 65 (FIG. 12C). Two neighboring structures of the remaining spacer structures 65 have a distance that is smaller than the distance between two neighboring structures of the original carrier structures 66. This distance can even be below the lithographic resolution.

In another example, further longitudinal structures (not shown) are created by double patterning similarly to the remaining structures 65, the further longitudinal structures running with an angle relative (e.g., perpendicular) to the structures 65 such that hole-like openings are created between the structures 65 and the further longitudinal structures.

Another example of producing a sub-lithographic structure is illustrated in FIG. 13. A plurality of dot-like first structures 67 is arranged in a grid with a first distance. In another step a plurality of second dot-likes structures 68 which also are arranged in a grid with the first distance (or another distance) is added to the first structure 67, wherein the second structures 68 are created in spaces between the first structures 67. This results in a pattern of dots, wherein the distance between one of the first structures 67 to a neighboring second structure 68 is smaller than the distance of the original grids and can be below the lithographic resolution.

In FIGS. 14A-14B, 15A-15C and 16A-16D, further examples of double patterning methods in the form of different spacer techniques are given.

Figure 14A:
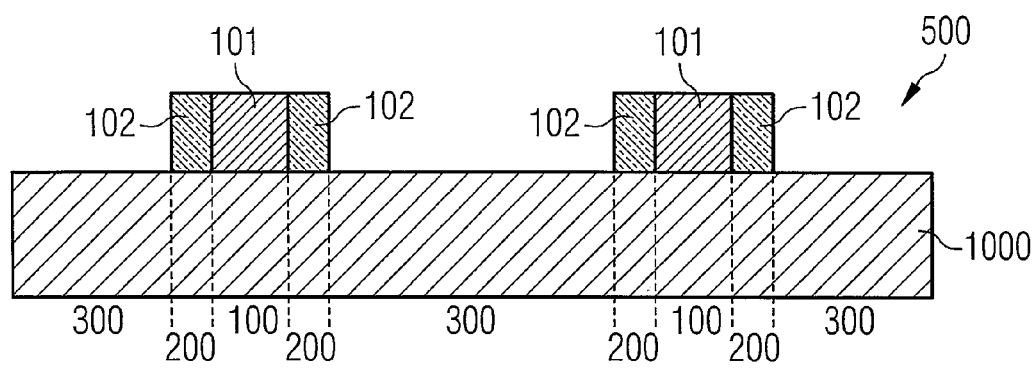
FIGS. 14A and 14B illustrate a third example of generating a structure by double patterning.

In FIG. 14A a cross section of a general structure 500 on a substrate 1000 in a semiconductor device is depicted. This structure 500 will be used to demonstrate an exemplary embodiment of a pitch fragmentation technique, i.e., a line by spacer technique (or a pattern by spacer technique if a more complex structure is used).

The general structure 500 shown in FIG. 14A might represent among other possibilities a conductive line in a memory chip or a microprocessor. The structure could also represent a line in an optoelectronic device or a microelectromechanical device (MEMS). The person skilled in the art will recognize that the pitch fragmentation techniques described here are not limited to straight lines but can be used to manufacture more complex patterns.

In the embodiment of the pitch fragmentation according to FIG. 14A, the initial first structure 101 is lined with a second structure in the form of sidewall structure 102 adjacent to the initial structure 101. The area of the substrate 1000 covered by the initial structure 101 is indicated by 100, the area covered by the sidewall structure 102 are indicated by 200.

The area 300 not covered by the initial structure 101 and the sidewall structure 102 remains free of material on its surface.

In the line by spacer technique shown, e.g., in FIG. 14A the area 100 covered by the initial structure 101 and the area 300 are transferred into the substrate 1000. Therefore, the initial structure 101 has to be removed, e.g., by an etching process which is selective to the sidewall structures 102.

Figure 14B:
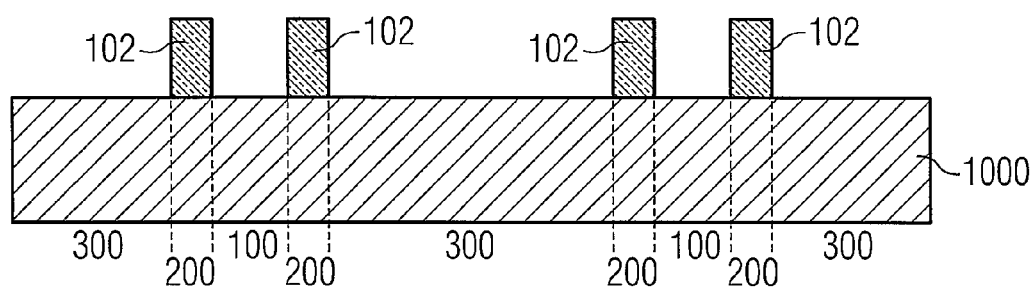

In FIG. 14B it is shown that only the sidewall structures 102 remain as spacer structures, since the spacer structures 102 have a relatively small width. A sub-lithographic pitch (i.e., a dimension of a pitch which is smaller than the capability of a certain illumination source) can be achieved due to the fact that each initial structure 101 has two sidewalls 102, thereby doubling the density of structures.

Figure 15A:
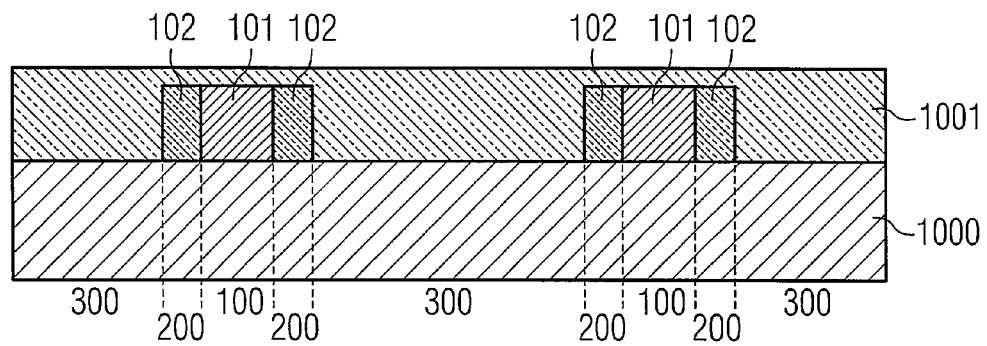
FIGS. 15A-15C illustrate a fourth example of generating a structure by double patterning.

In FIG. 15A a variation of the embodiment of FIG. 14A is shown in which a fill technique is used to transfer the area 300 into the substrate 1000. In this embodiment the area 300 between neighboring structures 101 (i.e., between opposite spacers 102 of the neighboring initial structures 101) is filled by some material (i.e., a plurality of third structures). A layer 1001 is deposited, covering the initial structure 101, the sidewall structure 102 (i.e., the spacer) and the area 300.

Figure 15B:
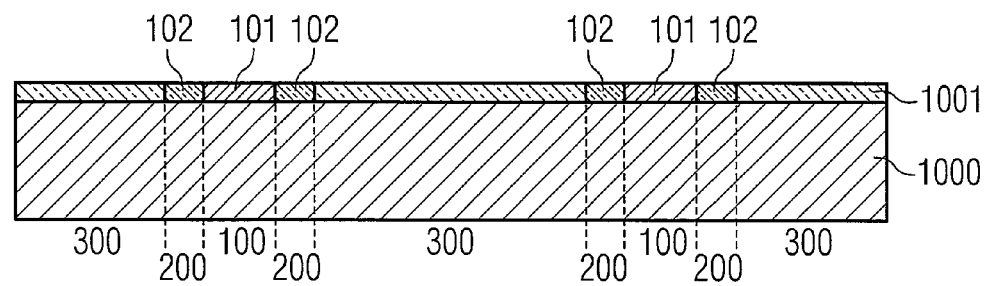

This stack is then recessed, e.g., by etching or CMP as shown in FIG. 15B. Subsequently, the spacer structures 102 are removed, e.g., by etching the spacers 102 selectively to the initial structures 101 and the layer in area 300. Now the lines (or the pattern) formed by the spacer structure 102 can be transferred into the substrate 1000.

Figure 15C:
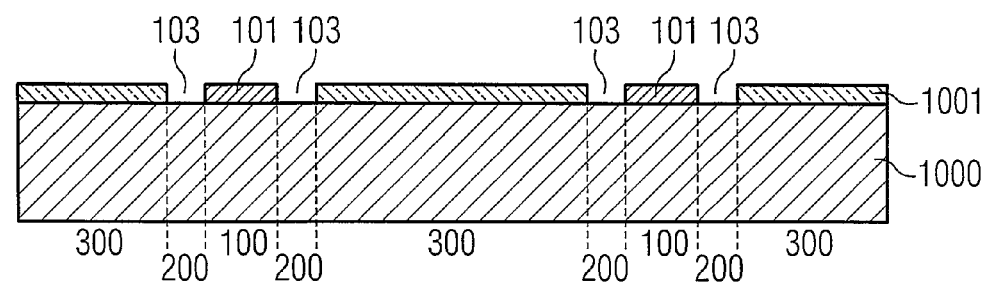

This is shown in FIG. 15C. The spacers 102 are removed by an etching process so that openings 103 are created. The remains of the layer 1001 and the initial structure 101 form the first mask layer, wherein the openings 103 are the first openings. In another example, the openings 103 are used to structure another layer which is then used as the first mask layer.

Figure 16A:
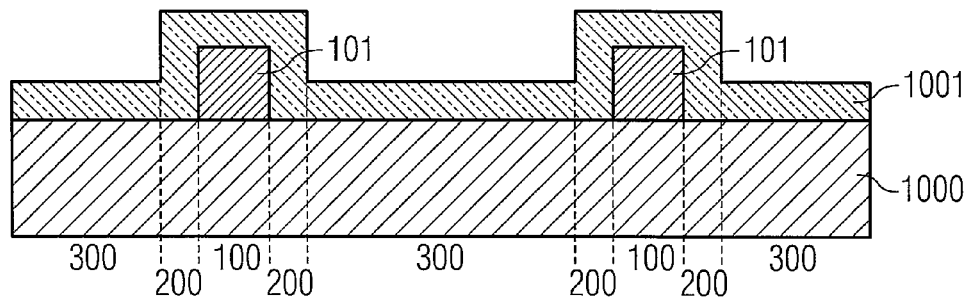
FIGS. 16A-16D illustrate a fifth example of generating a structure by double patterning.

Another fill technique is a line by liner fill (or pattern by liner fill). In FIG. 16A an initial first structure 101 and an area between the first structures 101 is covered by a first layer 1001. The first layer 1001 lines, among other areas, the sidewalls of the initial structure 101. Therefore, the sidewall structures (second structures) covering the areas 1001 are made by a liner material, rather than a spacer. A spacer etch is not required in this embodiment.

Figure 16B:
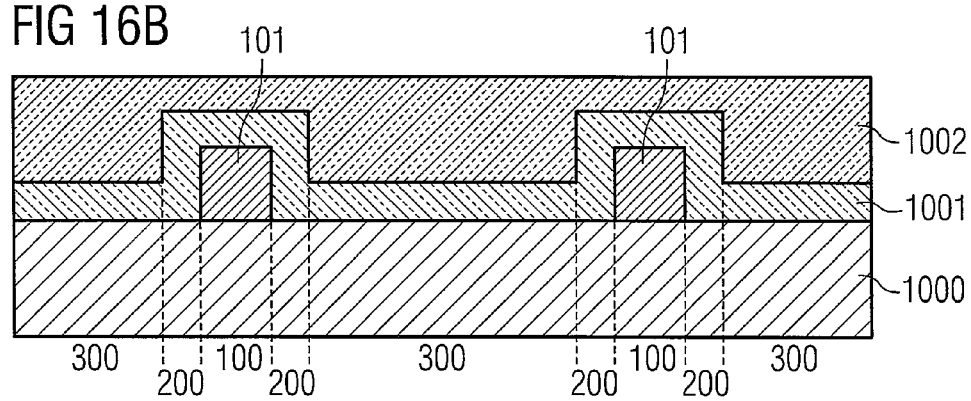

Subsequently, the stack shown in FIG. 16A is covered with a second liner 1002 which additionally fills the area between two neighboring first structures 101 as shown in FIG. 16B.

Figure 16C:
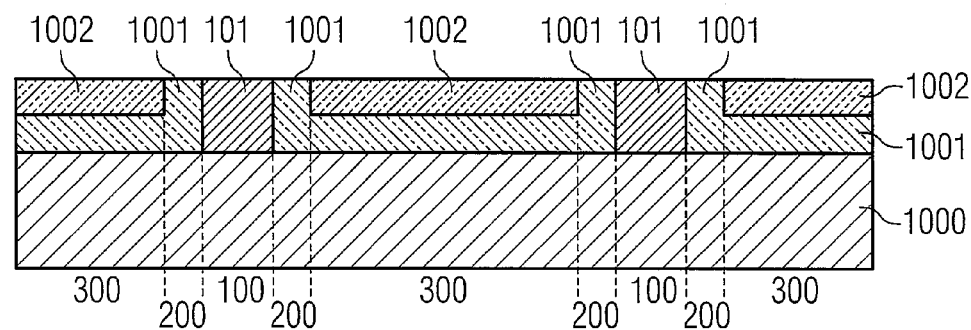
Figure 16D:
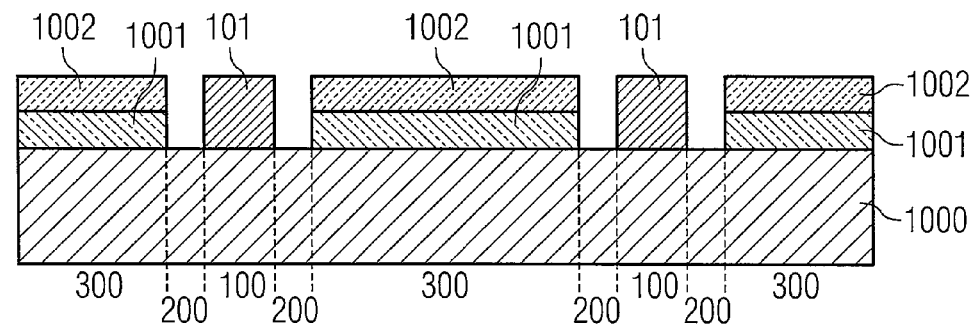

Subsequently, the second layer 1002 is recessed or planarized as indicated in FIG. 16C. In FIG. 16D it is shown that the liner material (first structures) from the first layer 1001 is then removed, e.g., by an anisotropical etching which is selective against the material of the initial structure and the material of the second liner. This results in openings being created which are the first openings of the first mask layer (wherein one of the layer 1001 and 1002 or the layer stack 1001, 1002 constitutes the first mask layer) or which can be used to create the first openings.

It will be understood by the person skilled in the art that the substrate 1000 does not have to be a single material but it might comprise structured layers. Further, although the method illustrated in FIGS. 14A and 14B results in longitudinal openings, the principle can be used to create hole like openings (e.g., contact holes), too. For this, the method is repeated after completion of the (longitudinal) openings (i.e., starting from a structure as shown in FIGS. 14B, 15C and 16D, respectively), wherein third structures (corresponding to the first structures 101) are created such that they cross the openings (i.e., at an angle with respect to the second structures 102 in FIG. 14B and with respect to the first structures 101 in FIGS. 15C and 16D). Further fourth structures (corresponding to the second structures 102) are created adjacent to the third structures The persons skilled in the art will recognize that the pitch fragmentation techniques can be used more than once in an area leading to higher order pitch fragmentations, i.e., ever smaller structures can be manufactured. Furthermore, it is possible to exploit different selectivities between materials to define combinations of regions or sub-regions to define the pattern to be transferred into the substrate S.

In addition the person skilled in the art will recognize that the embodiments of the pitch fragmentation techniques can be modified in many ways and can be used in different combinations and with all kinds of materials. The principles of the pitch fragmentations are not exhaustively covered by the examples given here. Further, as mentioned above many other double patterning methods are known in the art.

It is further noted that the invention is of course not limited to particular materials. The lower layer and the upper layer can be wiring layers, i.e., they can comprise conductive structures. The conductive structures in turn can be formed using a conductive or a semi-conductive material. However, instead of conductive structures the upper and the lower layer can also consist of non-conductive structures such as isolating structures (e.g., exclusively or in combination with conductive structures).

Moreover, it is noted that between two process steps described above one or more additional sub-steps can be carried out. Also, it is possible to use process steps of one embodiment with one or more of the other embodiments. For example, as described with respect to the first embodiment, the generation of the first mask layer on the second mask layer can be used with the other embodiments.

What is claimed is:

1. A method of fabricating an integrated circuit, the method comprising:
   creating a first mask layer in the form of a hard mask layer comprising a plurality of first openings;
   creating a second mask layer with at least one second opening that at least partially overlaps with one of the first openings, wherein, the at least one second opening is generated lithographically; and
   at least two neighboring first openings are distanced from each other with a center to center pitch that is smaller than a resolution limit of lithography used for generating the second opening.

2. The method according to claim 1, wherein at least some of the plurality of first openings are arranged in an array.

3. The method according to claim 1, wherein the plurality of first openings is generated using a double patterning process.

4. The method according to claim 3, wherein the double patterning process comprises:
   generating a plurality of first structures;
   generating a plurality of second structures adjacent to the first structures; and
   removing the first structures such that openings are created between the second structures that are first openings of the first mask layer or that are used to generate the first openings.

5. The method according to claim 3, wherein the double patterning process comprises:
   generating a plurality of first structures;
   generating a plurality of second structures adjacent to the first structures;
   generating a plurality of third structures between neighboring second structures; and
   removing the second structures such that openings are created between the first structures and the third structures which constitute first openings of the first mask layer or which are used to generate the first openings of the first mask layer.

6. The method according to claim 5, wherein the first structures are created lithographically and the openings which are generated by removing the second structures have a center to center pitch that is smaller than the resolution limit of lithography used for generating the first structures.

7. The method according to claim 3, wherein the double patterning process comprises:
   generating a plurality of longitudinal first structures;
   generating a plurality of second longitudinal structures adjacent to the first structures;
   removing the first structures such that longitudinal openings are created between the second structures;
   generating a plurality of longitudinal third structures extending with an angle relative to the second structures;
   generating a plurality of fourth longitudinal structures adjacent to the third structures; and
   creating openings by removing the third structures which constitute the first openings of the first mask layer or which are used to generate the first openings.

8. The method according to claim 7, wherein the first and third structures are created lithographically and the openings which are generated by removing the first and the third structures have a center to center pitch that is smaller than the resolution limit of the lithography used for generating the first and third structures.

9. The method according to claim 3, wherein the double patterning process comprises:
   generating a plurality of first structures such that spaces are created between the first structures; and
   generating a plurality of second structures in the spaces between the first structures such that openings are created between the first structures and neighboring second structures which constitute the first openings of the first mask layer or which are used to generate the first openings.

10. The method according to claim 9, wherein the first and second structures are generated lithographically and the center to center pitch of the openings is smaller than the resolution limit of the lithography used for generating the first and second structures.

11. The method according to claim 1, wherein the center to center pitch of neighboring first openings is smaller than 40 nm.

12. The method according to claim 1, wherein the second mask layer is at least partially arranged on the first mask layer.

13. The method according to claim 1, wherein the first mask layer is at least partially arranged on the second mask layer.

14. The method according to claim 1, wherein the second mask layer uncovers at least one of the first openings in the region of the second opening and covers at least another one of the first openings.

15. The method according to claim 1, wherein the first and the second mask layer is arranged over a further layer.

16. The method according to claim 15, wherein the further layer is arranged on a lower layer.

17. The method according to claim 16 further comprising performing an etching step using the first and the second mask layer in order to produce an opening in the further layer such that the lower layer is uncovered in the region of the second opening.

18. The method according to claim 17, further comprising removing the first and the second mask layer and filling the opening in the further layer with a material to create a connecting structure.

19. The method according to claim 18, wherein the material comprises a conductive material.

20. The method according to claim 17, wherein the lower layer and the further layer are etched in one step such that an opening in the lower layer is generated which is aligned with the opening in the further layer.

21. The method according to claim 20, wherein the lower layer comprises a plurality of lower longitudinal structures.

22. The method according to claim 21, wherein a recess etched in the lower layer interrupts one of the lower longitudinal structures.

23. The method according to claim 22, wherein at least one of the first openings overlaps with one of the lower longitudinal structures.

24. The method according to claim 18, further comprising arranging an upper layer over the further layer, the upper layer comprising a plurality of upper longitudinal structures.

25. The method according to claim 24, wherein at least one of the upper longitudinal structures is connected to one of the lower longitudinal structures by the connecting structure.

26. The method according to claim 25, wherein the lower and/or the upper longitudinal structures are generated using a double patterning step such that they have a center to center pitch which is smaller than the minimal structure size that can be achieved by a lithography step for forming the second opening in the second mask layer.

27. The method according to claim 1, wherein at least some of the first openings of the first mask layer are formed as longitudinal recesses.

28. The method according to claim 27, wherein
the first mask layer is arranged on a further layer which is generated on a lower layer, the lower layer comprising a plurality of lower longitudinal structures;
the longitudinal recesses of the first mask layer run at an angle with respect to the lower longitudinal structures such that a plurality of overlapping regions are created, where the longitudinal recesses overlap with the lower longitudinal structures;
the second opening of the second mask layer uncovers one of the overlapping regions such that the further layer is uncovered in the overlapping region; and
an etching step is performed using the first and the second mask layer to create an opening in the further layer such that the lower layer is uncovered in the overlapping region.

29. The method according claim 28, further comprising:
removing the second mask layer after the etching step;
filling the opening in the further layer with a material in order to form a connecting structure; and
filling the longitudinal recesses of the first mask layer with a material in order to form a plurality of upper longitudinal structures, wherein one of the upper longitudinal structure is connected to one of the lower longitudinal structures via the connecting structure.

30. A method of fabricating an integrated circuit, the method comprising:
forming a lower layer which comprises a plurality of lower longitudinal structures;
forming a further layer on the lower layer;
forming a first mask layer on the further layer comprising a plurality of first openings in the form of longitudinal recesses, wherein the longitudinal recesses of the first mask layer run at an angle with respect to the lower longitudinal structures such that a plurality of overlapping regions are created, where the longitudinal recesses overlap with the lower longitudinal structures;
forming a second mask layer comprising at least one second opening which uncovers one of the overlapping regions such that the further layer is uncovered in the overlapping region; and
performing an etching step using the first and the second mask layer to create an opening in the further layer such that the lower layer is uncovered in the overlapping region.

31. The method according claim 30, wherein the second opening is created by a lithography step and neighboring longitudinal recesses of the first mask layer have a maximal distance which is smaller than a minimal structure size that can be achieved by the lithography step.

32. The method according claim 31, wherein the longitudinal recesses of the first mask layer are generated by a double patterning method.

33. The method according to claim 1, wherein the integrated circuit is a memory device.

34. An integrated circuit generated by the method according to claim 1.

* * * * *